(12) United States Patent
Chung et al.

(10) Patent No.: US 12,396,213 B2
(45) Date of Patent: Aug. 19, 2025

(54) SEMICONDUCTOR DEVICE AND METHOD OF FABRICATING THE SAME

(71) Applicant: Samsung Electronics Co., Ltd., Suwon-si (KR)

(72) Inventors: Noyoung Chung, Hwaseong-si (KR); Taekyum Kim, Suwon-si (KR); Hyunyong Jeong, Suwon-si (KR); Sang-Hwa Lee, Seoul (KR); Byung Je Jung, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 350 days.

(21) Appl. No.: 17/732,947

(22) Filed: Apr. 29, 2022

(65) Prior Publication Data

US 2023/0075320 A1 Mar. 9, 2023

(30) Foreign Application Priority Data

Sep. 8, 2021 (KR) ......................... 10-2021-0119822

(51) Int. Cl.
*H10D 30/67* (2025.01)
*H10D 64/27* (2025.01)

(52) U.S. Cl.
CPC ....... *H10D 30/6748* (2025.01); *H10D 64/511* (2025.01)

(58) Field of Classification Search
CPC .......... H01L 29/78687; H01L 29/4232; H01L 29/42372; H01L 29/42376; H01L 29/4238; H01L 21/0332; H01L 21/0334; H01L 21/0337; H01L 21/308; H01L 21/3081; H01L 21/3083; H01L 21/3086; H01L 21/3088; H01L 21/31144; H01L 21/565; H01L 29/0673; H01L 29/0847;
(Continued)

(56) References Cited

U.S. PATENT DOCUMENTS 9,502,261 B2 11/2016 Liu et al.
9,953,126 B2 4/2018 Kodama et al.
(Continued)

FOREIGN PATENT DOCUMENTS

TW 201824347 A 7/2018

OTHER PUBLICATIONS

Taiwanese Office Action dated Jul. 8, 2025 issued in Taiwanese Patent Application No. 11420716990.

*Primary Examiner* — Natalia A Gondarenko
(74) *Attorney, Agent, or Firm* — Harness, Dickey & Pierce, P.L.C.

(57) ABSTRACT

Disclosed are semiconductor devices and their fabrication methods. The semiconductor device comprises a logic cell on a substrate, and a first metal layer on the logic cell. The first metal layer includes first and second power lines and first to third lower lines on first to third wiring tracks therebetween. The first to third wiring tracks extend in parallel in the first direction. The first lower line includes first and second lines spaced apart in the first direction from each other at a first distance. The third lower line includes third and fourth lines spaced apart in the first direction at a second distance. The first line has a first end facing the second line. The third line has a second end facing the fourth line. A curvature at the first end is substantially the same as that at the second end.

18 Claims, 37 Drawing Sheets

(58) Field of Classification Search
CPC ......... H01L 29/775; H01L 2027/11875; H01L 21/76816; H01L 21/7684; H01L 21/823821; H01L 21/823814; H01L 21/823864; H01L 21/823871; H01L 27/0207; H01L 27/092; H01L 27/0922; H01L 27/0924; H01L 27/0928; H01L 27/1211; H01L 23/5226; H01L 23/528; H01L 23/5283; H01L 23/522; H01L 23/5286; H01L 23/535; H01L 23/53228; H01L 23/5386; H01L 23/53257; H01L 23/585; H01L 29/0665; H01L 29/41791; H01L 29/41783; H01L 29/401; H01L 29/66795; H01L 29/785; H10D 30/43; H10D 30/6748; H10D 64/511; H10D 62/121; H10D 62/151; H10D 84/0165; H10D 84/017; H10D 84/038; H10D 84/85; H10D 84/975; H10D 84/981; H10D 84/983; H10D 89/10

USPC ....... 257/443, 207, 202, 203, 206, 401, 750, 257/758

See application file for complete search history.

(56) References Cited

U.S. PATENT DOCUMENTS

| | | |
|---|---|---|
| 10,170,306 B2 | 1/2019 | Lee et al. |
| 10,373,829 B1 | 8/2019 | Hsieh et al. |
| 10,395,926 B1 | 8/2019 | Tang et al. |
| 10,483,204 B2 | 11/2019 | Chen et al. |
| 11,043,394 B1 | 6/2021 | Hautala |
| 2014/0239406 A1* | 8/2014 | Tsuda .................. H01L 27/092 257/369 |
| 2018/0254287 A1* | 9/2018 | Seo ....................... H01L 23/528 |
| 2019/0206893 A1 | 7/2019 | Liaw |
| 2019/0318968 A1 | 10/2019 | Seo et al. |
| 2021/0165947 A1 | 6/2021 | Park et al. |
| 2021/0265166 A1 | 8/2021 | Dechene et al. |
| 2022/0216150 A1 | 7/2022 | Shin et al. |

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0119822 filed on Sep. 8, 2021 in the Korean Intellectual Property Office, the disclosure of which is hereby incorporated by reference in its entirety.

BACKGROUND

Some example embodiments relate to a semiconductor device and/or a method of fabricating the same, and more particularly, to a semiconductor device including a field effect transistor and/or a method of fabricating the same.

A semiconductor device includes an integrated circuit including metal oxide semiconductor field effect transistors (MOSFETs). As sizes and/or design rules of the semiconductor device are gradually decreased, sizes of the MOSFETs are also increasingly scaled down. The scaling down of MOSFETs may deteriorate operating characteristics of the semiconductor device. Accordingly, various studies have been conducted to develop methods of fabricating semiconductor devices having superior performances while overcoming limitations caused by high integration of the semiconductor devices.

SUMMARY

Some example embodiments provide a semiconductor device with increased reliability and a method of fabricating the same.

According to some example embodiments, a semiconductor device may comprise: a logic cell on a substrate, the logic cell including a PMOSFET region and an NMOSFET region; and a first metal layer on the logic cell. The first metal layer may include: a first power line and a second power line that extend parallel to each other along a first direction; and a first lower line, a second lower line, and a third lower line respectively on a first wiring track, a second wiring track, and a third wiring track that are defined between the first power line and the second power line. The first, second, and third wiring tracks may extend parallel to each other along the first direction. The first lower line may include a first line and a second line that are spaced apart from each other in the first direction by a first distance. The third lower line may include a third line and a fourth line that are spaced apart from each other in the first direction by a second distance different from the first distance. The first line may have a first end that faces the second line. The third line may have a second end that faces the fourth line. A curvature at the first end may be the same as a curvature at the second end.

According to some example embodiments, a semiconductor device may comprise: a logic cell on a substrate, the logic cell including a PMOSFET region and an NMOSFET region; and a first metal layer on the logic cell. The first metal layer may include: a first power line and a second power line that extend parallel to each other along a first direction; and a first lower line, a second lower line, and a third lower line respectively on a first wiring track, a second wiring track, and a third wiring track that are defined between the first power line and the second power line. The first, second, and third wiring tracks may extend parallel to each other along the first direction. The first lower line may include a first line and a second line that are parallel to each other and extend along the first direction. The third lower line may include a third line and a fourth line that are parallel to each other and extend along the first direction. A tip-to-tip distance between the first line and the second line may be a first distance. A tip-to-tip distance between the third line and the fourth line may be a second distance. Each of the first distance and the second distance may be a specific distance having a value between about 24 nm and about 60 nm. The first distance and the second distance may be different from each other.

According to some example embodiments, a semiconductor device may comprise: an active pattern on a substrate; a device isolation layer that fills a trench defining the active pattern; a source/drain pattern on the active pattern and a channel pattern connected to the source/drain pattern, the channel pattern including a first semiconductor pattern, a second semiconductor pattern, and a third semiconductor pattern that are sequentially stacked and spaced apart from each other; a gate electrode that extends while running across the channel pattern, the gate electrode including a first part between the active pattern and the first semiconductor pattern, a second part between the first semiconductor pattern and the second semiconductor pattern, a third part between the second semiconductor pattern and the third semiconductor pattern, and a fourth part on the third semiconductor pattern; a gate dielectric layer between the channel pattern and the gate electrode; a plurality of gate spacers on opposite sidewalls of the fourth part of the gate electrode; a gate capping pattern on a top surface of the gate electrode; a first interlayer dielectric layer on the gate capping pattern; an active contact that penetrates the first interlayer dielectric layer and couples to the source/drain pattern; a gate contact that penetrates the first interlayer dielectric layer and couples to the gate electrode; a second interlayer dielectric layer on the first interlayer dielectric layer; a first metal layer in the second interlayer dielectric layer, the first metal layer connected to the active contact and the gate contact; a third interlayer dielectric layer on the second interlayer dielectric layer; and a second metal layer in the third interlayer dielectric layer. The first metal layer may include: a first power line and a second power line that extend parallel to each other along a first direction; and a first lower line, a second lower line, and a third lower line respectively on a first wiring track, a second wiring track, and a third wiring track that are defined between the first power line and the second power line. The first, second, and third wiring tracks may extend parallel to each other along the first direction. The first lower line may include a first line and a second line that are spaced apart from each other in the first direction at a first distance. The third lower line may include a third line and a fourth line that are spaced apart from each other in the first direction at a second distance different from the first distance. The first line may have a first end that faces the second line. The third line may have a second end that faces the fourth line. A curvature at the first end may be the same as a curvature at the second end.

According to some example embodiments, a method of fabricating a semiconductor device may comprise: forming an etch-target layer on a substrate; forming a mold layer on the etch-target layer; forming on the mold layer a first mask pattern including a primary opening, the primary opening including a first opening and a second opening that are adjacent to each other in a first direction; allowing the first mask pattern to undergo a first elongation etching process to form a bridge part that connects the first opening to the second opening, one connection opening being defined by the first opening, the second opening, and the bridge part; forming in the connection opening a spacer to separate the first opening and the second opening from each other; using the first mask pattern and the spacer as an etching mask to sequentially etch the mold layer and the etch-target layer to form a plurality of wiring holes that correspond to the first opening and the second opening; and filling the wiring holes with metal to form a plurality of wiring lines.

DETAILED DESCRIPTION OF VARIOUS EXAMPLE EMBODIMENTS

Figure 1:
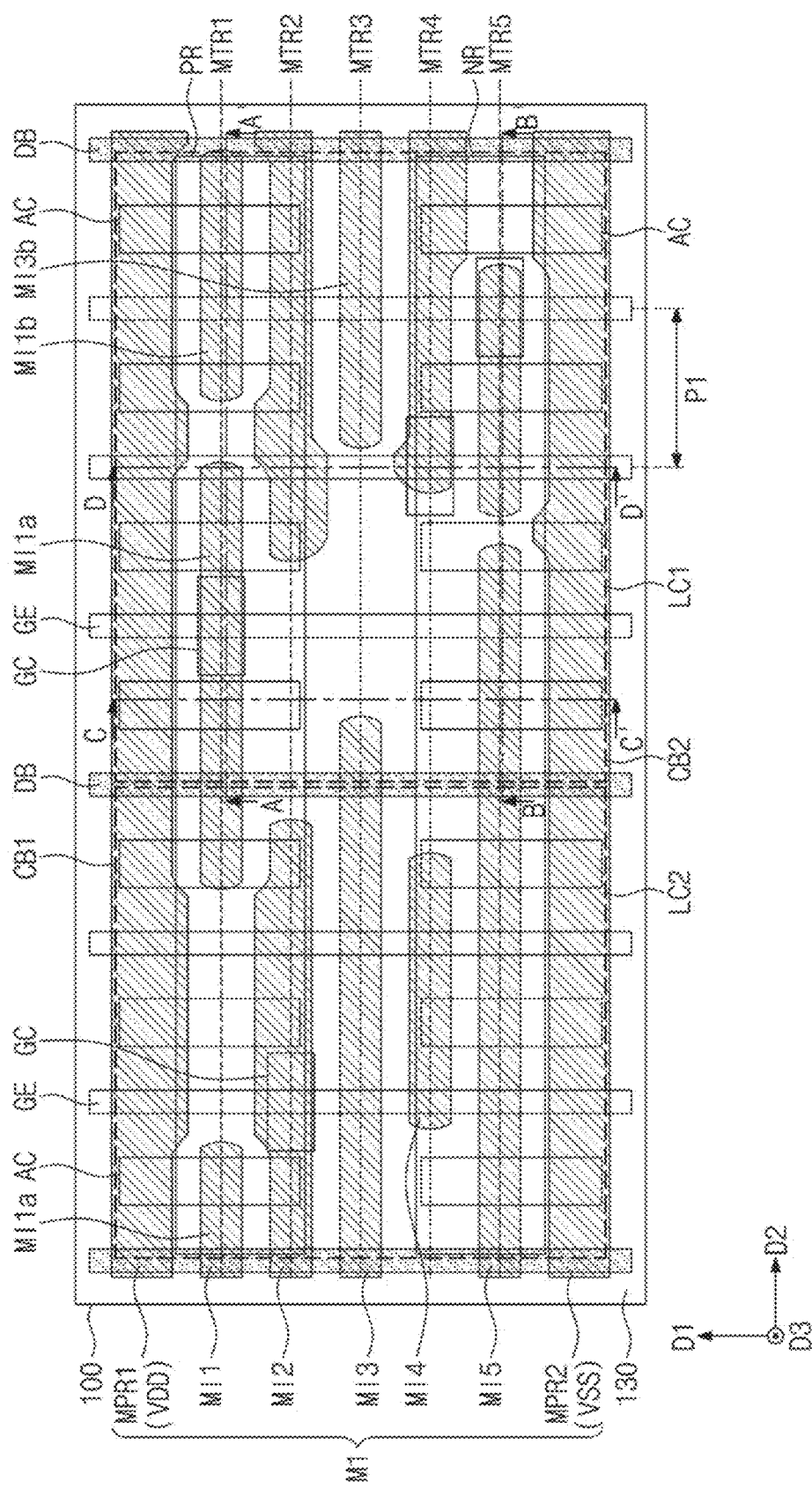
FIG. 1 illustrates a plan view showing a semiconductor device according to some example embodiments.
Figure 2A:
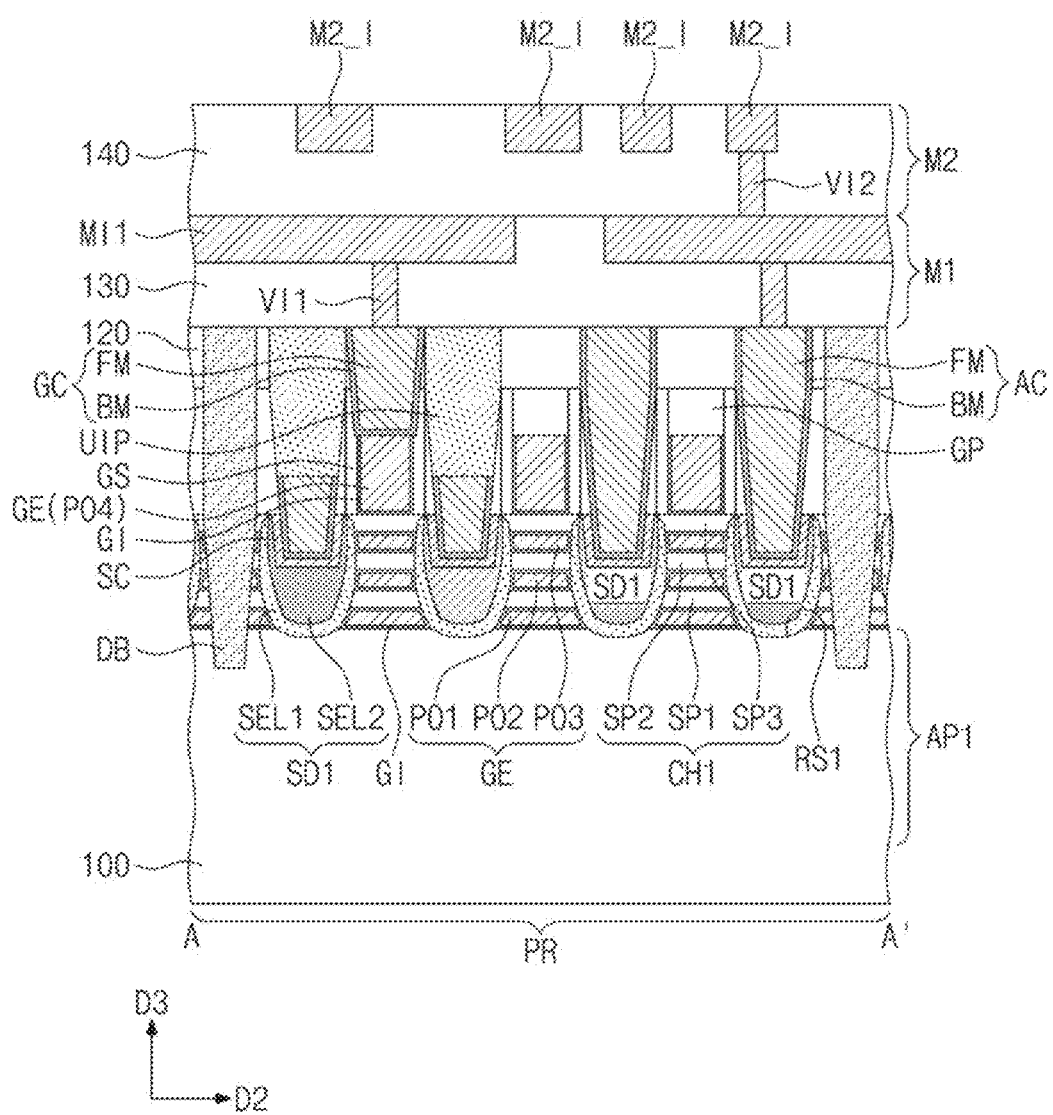
FIGS. 2A, 2B, 2C, and 2D illustrate cross-sectional views respectively taken along lines A-A', B-B', C-C', and D-D' of FIG. 1.
Figure 2B:
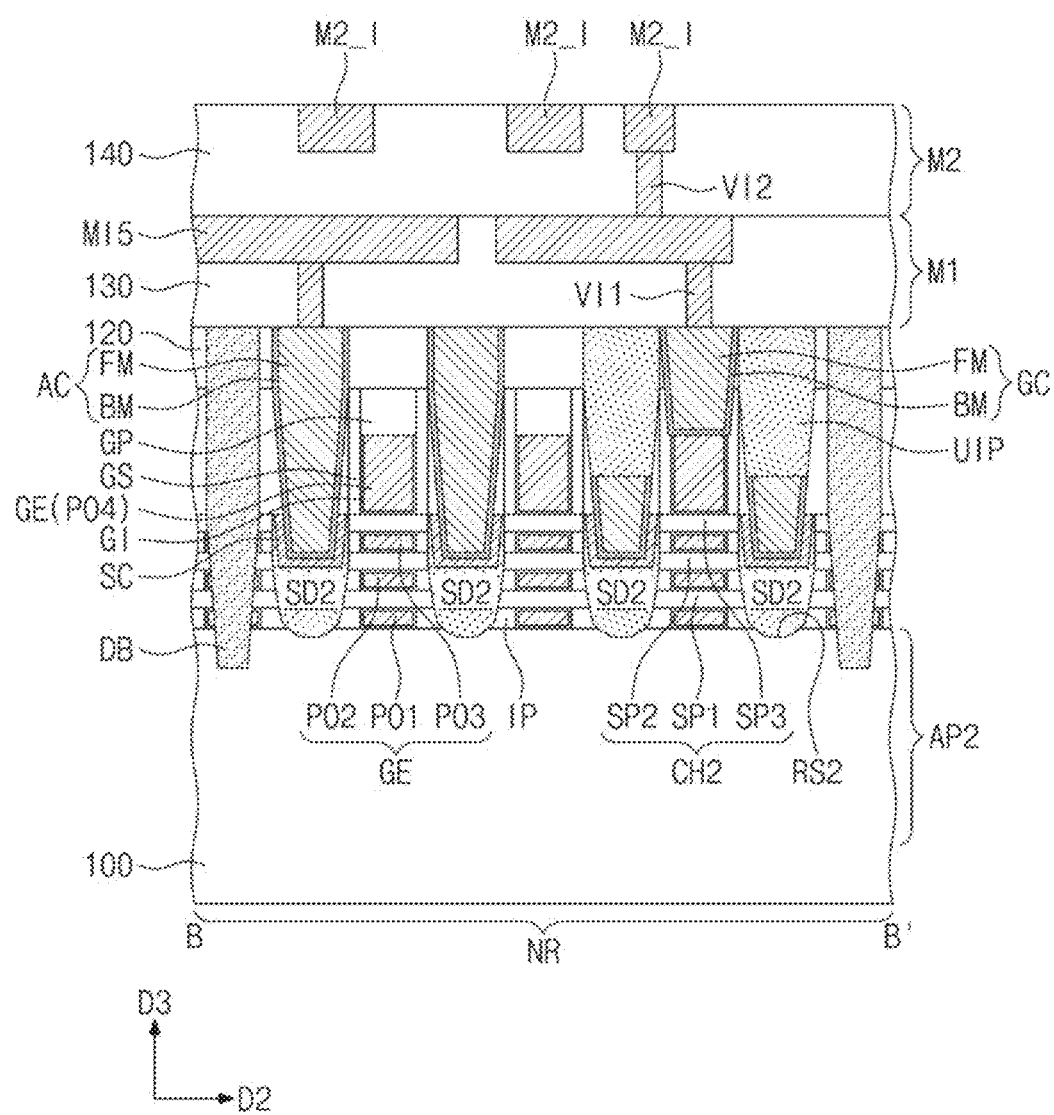
Figure 2C:
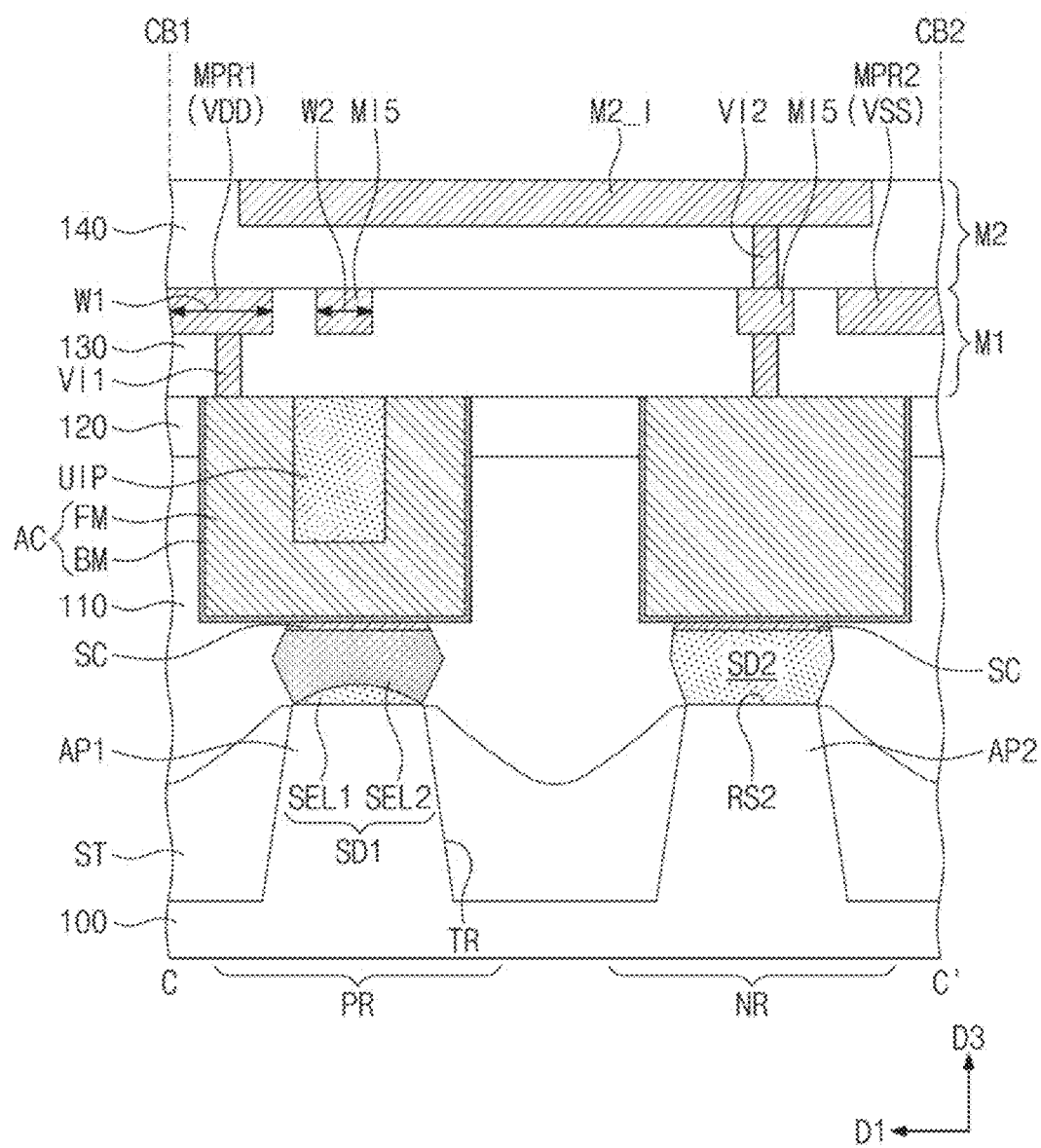
Figure 2D:
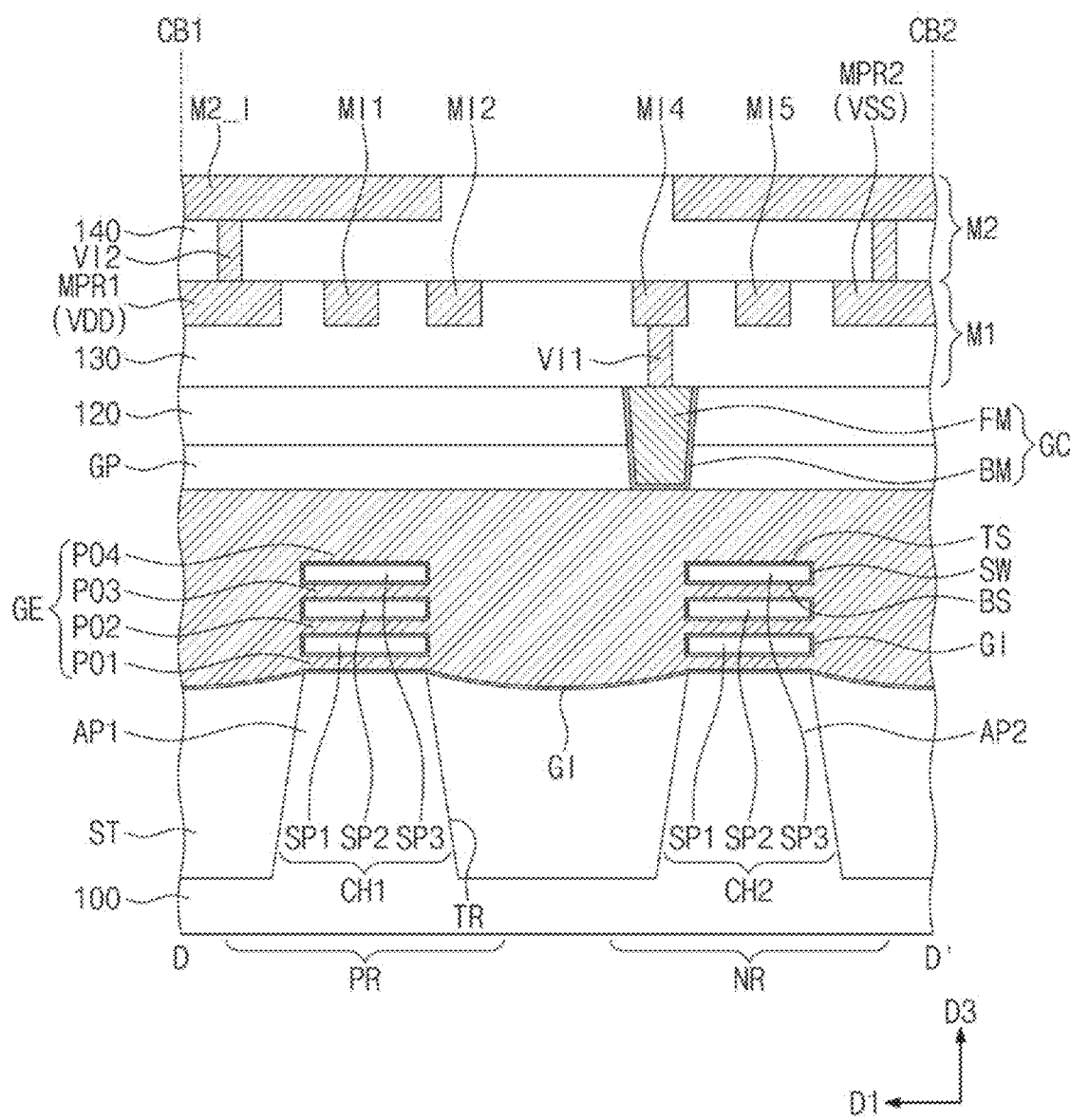

FIG. 1 illustrates a plan view showing a semiconductor device according to some example embodiments. FIGS. 2A, 2B, 2C, and 2D illustrate cross-sectional views respectively taken along lines A-A', B-B', C-C', and D-D' of FIG. 1.

Referring to FIGS. 1 and 2A to 2D, a plurality of logic cells LC1 and LC2 may be provided on a substrate 100. The substrate 100 may be or may include a compound semiconductor substrate or a semiconductor substrate including one or more of silicon, germanium, or silicon-germanium. For example, the substrate 100 may be a silicon substrate, may be single-crystalline, and may be doped, e.g. may be lightly doped; however, example embodiments are not limited thereto.

The logic cells LC1 and LC2 may include, for example, a first logic cell LC1 and a second logic cell LC2 that are located adjacent to each other in a second direction D2. Each of the first and second logic cells LC1 and LC2 may have logic transistors included in a logic circuit. Each of the first and second logic cells LC1 and LC2 may include a PMOSFET region PR and an NMOSFET region NR. The PMOSFET region PR and the NMOSFET region NR may be spaced apart from each other in a first direction D1. Note that the second direction D2 may or may not correspond a second direction recited in the claims. Note that the first direction D1 may or may not correspond to a direction recited below in the claims.

A first active pattern AP1 and a second active pattern AP2 may be defined by a trench TR formed on an upper portion of the substrate 100. The first active pattern AP1 and the second active pattern AP2 may be respectively provided on the PMOSFET region PR and the NMOSFET region NR. The first and second active patterns AP1 and AP2 may extend in the second direction D2. The first and second active patterns AP1 and AP2 may be vertically protruding portions of the substrate 100.

The trench TR may be filled with a device isolation layer ST. The device isolation layer ST may include a silicon oxide layer. The device isolation layer ST may not cover any of or either of first and second channel patterns CH1 and CH2, which will be discussed below.

A first channel pattern CH1 may be provided on the first active pattern AP1. A second channel pattern CH2 may be provided on the second active pattern AP2. Each of the first and second channel patterns CH1 and CH2 may include a first semiconductor pattern SP1, a second semiconductor pattern SP2, and a third semiconductor pattern SP3, with the first through third semiconductor patterns SP1 to SP3 sequentially stacked. The first, second, and third semiconductor patterns SP1, SP2, and SP3 may be spaced apart from each other in a vertical direction, e.g. a third direction D3 that is perpendicular to a surface of the substrate 100.

The first, second, and third semiconductor patterns SP1, SP2, and SP3 may each independently or jointly include one or more of silicon (Si), germanium (Ge), and silicon-germanium (SiGe). For example, each of the first, second, and third semiconductor patterns SP1, SP2, and SP3 may include crystalline silicon such as single-crystal or polycrystal silicon. Although three semiconductor patterns are illustrated, example embodiments are not limited thereto, and there may be more than three or less than three semiconductor patterns.

A plurality of first source/drain patterns SD1 may be provided on the first active pattern AP1. A plurality of first recesses RS1 may be formed on an upper portion of the first active pattern AP1. The first source/drain patterns SD1 may be provided in corresponding first recesses RS1. The first source/drain patterns SD1 may be impurity regions having a first conductivity type (e.g., p-type and including impurities such as boron). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second source/drain patterns SD2 may be provided on the second active pattern AP2. A plurality of second recesses RS2 may be formed on an upper portion of the second active pattern AP2. The second source/drain patterns SD2 may be provided in corresponding second recesses RS2. The second source/drain patterns SD2 may be impurity regions having a second conductivity type (e.g., n-type and including impurities such as at least one of arsenic or phosphorus). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns, e.g. patterns formed by a selective epitaxial growth process. For example, each of the first and second source/drain patterns SD1 and SD2 may have a top surface located at a level substantially the same as that of a top surface of the third semiconductor pattern SP3. For another example, each of the first and second source/drain patterns SD1 and SD2 may have a top surface located at a higher level than that of a top surface of the third semiconductor pattern SP3.

The first source/drain patterns SD1 may include a semiconductor element (e.g., SiGe) whose lattice constant is greater than that of a semiconductor element of the substrate 100. Therefore, a pair of first source/drain patterns SD1 may provide the first channel pattern CH1 with stress, e.g. with compressive stress. The second source/drain patterns SD2 may include the same semiconductor element (e.g., Si) as that of the substrate 100, and may or may not include a material that induces either tensile or compressive stress to the second channel pattern CH2.

Each of the first source/drain patterns SD1 may include a first semiconductor layer SEL1 and a second semiconductor layer SEL2 on the first semiconductor layer SEL1. With reference back to FIG. 2A, the following will describe a cross-sectional shape in the second direction D2 of the first source/drain pattern SD1.

The first semiconductor layer SEL1 may cover an inner wall of the first recess RS1. The first semiconductor layer SEL1 may have a thickness that decreases in a direction from a lower portion thereof toward an upper portion thereof. For example, a thickness in the third direction D3 of the first semiconductor layer SEL1 on a bottom surface of the first recess RS1 may be greater than a thickness in the second direction D2 of the first semiconductor layer SEL1 on an upper portion of the first recess RS1. The first semiconductor layer SEL1 may be shaped like a letter U (or an upside-down U) along a profile of the first recess RS1.

The second semiconductor layer SEL2 may fill an unoccupied portion of the first recess RS1 filled with the first semiconductor layer SEL1. The second semiconductor layer SEL2 may have a volume greater than that of the first semiconductor layer SEL1. For example, a volume ratio of the second semiconductor layer SEL2 to the first source/drain pattern SD1 may be greater than a volume ratio of the first semiconductor layer SEL1 to the first source/drain pattern SD1.

Each of the first and second semiconductor layers SEL1 and SEL2 may include silicon-germanium (SiGe). The first semiconductor pattern SP1 may contain germanium (Ge) whose concentration is relatively low. In some example embodiments, the first semiconductor layer SEL1 may include only silicon (Si) and may not include germanium (Ge). The first semiconductor layer SEL1 may contain germanium (Ge) whose concentration ranges from about 0 at % to about 10 at %.

The second semiconductor layer SEL2 may contain germanium (Ge) whose concentration is relatively high. For example, the second semiconductor layer SEL2 may contain germanium (Ge) whose concentration ranges from about 30 at % to about 70 at %. The concentration of germanium (Ge) contained in the second semiconductor layer SEL2 may increase in the third direction D3. For example, the second semiconductor layer SEL2 adjacent to the first semiconductor layer SEL1 may have a germanium concentration of about 40 at %, but an upper portion of the second semiconductor layer SEL2 may have a germanium concentration of about 60 at %.

The first and second semiconductor layers SEL1 and SEL2 may include impurities (e.g., boron) that cause the first source/drain pattern SD1 to have a p-type conductivity type. An impurity concentration (e.g., atomic percent) of the second semiconductor layer SEL2 may be greater than an impurity concentration of the first semiconductor layer SEL1.

The first semiconductor layer SEL1 may prevent or reduce the probability of and/or impact from stacking faults between the substrate 100 and the second semiconductor layer SEL2 and between the second semiconductor layer SEL2 and the first, second, and third semiconductor patterns SP1, SP2, and SP3. The occurrence of stacking faults may increase a channel resistance. The stacking faults may more easily occur at bottom of the first recess RS1. Accordingly, it may be preferable that the first semiconductor layer SEL1 adjacent to the bottom of the first recess RS1 has a relatively large thickness to prevent or reduce the likelihood of and/or impact from the stacking faults.

The first semiconductor layer SEL1 may protect the second semiconductor layer SEL2 while sacrificial layers SAL are replaced with first, second, and third parts PO1, PO2, and PO3 of a gate electrode GE, which will be discussed below. For example, the first semiconductor layer SEL1 may prevent or reduce the likelihood of and/or impact from the second semiconductor layer SEL2 from being etched with an etching material that etches the sacrificial layers SAL.

Gate electrodes GE may be provided to extend in the first direction D1, while running across the first and second channel patterns CH1 and CH2. The gate electrodes GE may be arranged at a first pitch P1 in the second direction D2. Each of or at least some of the gate electrodes GE may vertically overlap the first and second channel patterns CH1 and CH2.

The gate electrode GE may include a first part PO1 interposed between the first semiconductor pattern SP1 and the active pattern AP1 or AP2, a second part PO2 interposed between the first semiconductor pattern SP1 and the second semiconductor pattern SP2, and a third part PO3 interposed between the second semiconductor pattern SP2 and the third semiconductor pattern SP3, and a fourth part PO4 on the third semiconductor pattern SP3. Although four parts are illustrated, example embodiments are not limited thereto, and there may be more than four parts or less than four parts.

Referring back to FIG. 2A, on the PMOSFET region PR, the gate electrode GE may have different widths at the first, second, and third parts PO1, PO2, and PO3 thereof. For example, a first width such as a maximum width in the second direction D2 of the third part PO3 may be greater than a second width such as a maximum width in the second direction D2 of the second part PO2. A width such as a maximum width in the second direction D2 of the first part PO1 may be greater than a width such as maximum in the second direction D2 of the third part PO3.

Referring back to FIG. 2D, the gate electrode GE may be provided on a top surface TS, a bottom surface BS, and opposite sidewalls SW of each of the first, second, and third semiconductor patterns SP1, SP2, and SP3. In this sense, a transistor according to some example embodiments may be a three-dimensional field effect transistor (e.g., MBCFET™) in which the gate electrode GE three-dimensionally surrounds the first and second channel patterns CH1 and CH2.

Referring back to FIGS. 1 and 2A to 2D, a pair of gate spacers GS may be disposed on opposite sidewalls of the fourth part PO4 of the gate electrode GE. The gate spacers GS may extend in the first direction D1 along the gate electrode GE. The gate spacers GS may have their top surfaces higher than that of the gate electrode GE. The top surfaces of the gate spacers GS may be coplanar with that of a first interlayer dielectric layer 110 which will be discussed below. The gate spacers GS may include at least one selected from SiCN, SiCON, and SiN. Alternatively, the gate spacers GS may each include a multi-layer formed of at least two selected from SiCN, SiCON, and SiN.

A gate capping pattern GP may be provided on the gate electrode GE. The gate capping pattern GP may extend in the first direction D1 along the gate electrode GE. The gate capping pattern GP may include a material having an etch selectivity with respect to first and second interlayer dielectric layers 110 and 120, which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may cover the top surface TS, the bottom surface BS, and the opposite sidewalls SW of each of the first, second, and third semiconductor patterns SP1, SP2, and SP3. The gate dielectric layer GI may cover the top surface of the device isolation layer ST below the gate electrode GE (see FIG. 2D).

In some example embodiments, the gate dielectric layer GI may include one or more of a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

In some example embodiments, a semiconductor device according to inventive concepts may include a negative capacitance field effect transistor that uses a negative capacitor. For example, the gate dielectric layer GI may include a ferroelectric material layer that exhibits ferroelectric properties and a paraelectric material layer that exhibits paraelectric properties.

The ferroelectric material layer may have a negative capacitance, and the paraelectric material layer may have a positive capacitance. For example, when two or more capacitors are connected in series, and when each capacitor has a positive capacitance, an overall capacitance may be reduced to be less than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of less than about 60 mV/decade at room temperature.

The ferroelectric material layer may have ferroelectric properties. The ferroelectric material layer may include, for example, one or more of hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include at least one selected from aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but inventive concepts are not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but inventive concepts are not limited thereto. Because ferroelectric materials have their own specific or critical thickness that exhibits ferroelectric properties, the thickness of the ferroelectric material layer may depend on ferroelectric material.

For example, the gate dielectric layer GI may include a single ferroelectric material layer. For another example, the gate dielectric layer GI may include a plurality of ferroelectric material layers that are spaced apart from each other. The gate dielectric layer GI may have a stack structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a specific or desired threshold voltage of a transistor. For example, the first, second, and third parts PO1, PO2, and PO3 of the gate electrode GE may be formed of the first metal pattern and/or of a work function metal.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is less than that of the first metal pattern. For example, the second metal pattern may include at least one metal selected from tungsten (W), aluminum (Al), titanium (Ti), and tantalum (Ta). The fourth part PO4 of the gate electrode GE may include, for example, the first metal pattern and the second metal pattern on the first metal pattern.

Referring back to FIG. 2B, inner spacers IP may be provided on the NMOSFET region NR. The inner spacers IP may be correspondingly interposed between the second source/drain pattern SD2 and the first, second, and third parts PO1, PO2, and PO3 of the gate electrode GE. The inner spacers IP may be in contact with or in direct contact with the second source/drain pattern SD2. The inner spacer IP may separate the second source/drain pattern SD2 from each of the first, second, and third parts PO1, PO2, and PO3 of the gate electrode GE.

A first interlayer dielectric layer 110 may be provided on the substrate 100. The first interlayer dielectric layer 110 may cover the gate spacers GS and the first and second source/drain patterns SD1 and SD2. The first interlayer dielectric layer 110 may have a top surface substantially coplanar with that of the gate capping pattern GP and that of the gate spacer GS. The first interlayer dielectric layer 110 may be provided thereon, with a second interlayer dielectric layer 120 that covers the gate capping pattern GP. For example, the first and second interlayer dielectric layers 110 and 120 may include a silicon oxide layer.

Each of the first and second logic cells LC1 and LC2 may be provided on respective opposite sides with a pair of separation structures DB that face each other in the second direction D2. For example, the separation structure DB may be provided on a boundary between the first and second logic cells LC1 and LC2. The separation structure DB may extend in the first direction D1 parallel to the gate electrodes GE. The separation structure DB and the respective adjacent gate electrode GE may be arranged at a pitch the same as the first pitch P1.

The separation structure DB may penetrate the first and second interlayer dielectric layers 110 and 120, and may extend into the first and second active patterns AP1 and AP2. The separation structure DB may penetrate the first and second channel patterns CH1 and CH2. The separation structure DB may separate and/or isolate the PMOSFET and NMOSFT regions PR and NR of the first logic cell LC1 from the PMOSFET and NMOSFT regions PR and NR of the second logic cell LC2.

Active contacts AC may be provided to penetrate the first and second interlayer dielectric layers 110 and 120 and to correspondingly have electrical connection with the first and second source/drain patterns SD1 and SD2. A pair of active contacts AC may be provided on opposite sides of the gate electrode GE. When viewed in plan, the active contact AC may have a bar shape that extends in the first direction D1.

Each or at least one active contact AC may be a self-aligned contact. For example, the gate capping pattern GP and the gate spacer GS may be used to form the active contact AC in a self-alignment manner. The active contact AC may cover, for example, at least a portion of a sidewall of the gate spacer GS. Although not shown, the active contact AC may cover a portion of the top surface of the gate capping pattern GP.

A silicide pattern SC may be interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, at least one selected from titanium silicide, tantalum silicide, tungsten silicide, nickel silicide, and cobalt silicide.

A gate contact GC may be provided to penetrate the second interlayer dielectric layer 120 and the gate capping pattern GP and to have electrical connection with the gate electrode GE. For example, referring to FIGS. 2A and 2C, the active contact AC may have an upper portion adjacent to the gate contact GC, and the upper portion of the active contact AC may be filled with an upper dielectric pattern UIP. Therefore, it may be possible to prevent or reduce the likelihood of and/or impact from a process failure such as an electrical short caused by contact between the gate contact GC and its adjacent active contact AC.

Each of or at least some of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may cover sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in a third interlayer dielectric layer 130. The first metal layer M1 may include first and second power lines MPR1 and MPR2, first to fifth lower lines MI1 to MI5, and lower vias VI1. The lower vias VI1 may be provided thereunder with the first and second power lines MPR1 and MPR2 and the first to fifth lower lines MI1 to MI5.

The first and second power lines MPR1 and MPR2 may extend in parallel to each other in the second direction D2, while running across the first and second logic cells LC1 and LC2. A voltage such as a drain voltage VDD and another voltage such as a source voltage VSS may be applied to the first power line MPR1 and the second power line MPR2, respectively.

Referring back to FIG. 1, a first cell boundary CB1 may be defined to extend in the second direction D2 on each of the first and second logic cells LC1 and LC2. On a location opposite to that of the first cell boundary CB1, a second cell boundary CB2 may be defined to extend in the second direction D2. The first cell boundary CB1 may be provided thereon with the first power line MPR1 to which the drain voltage VDD is applied. For example, the first power line MPR1 to which the drain voltage VDD is applied may extend in the second direction D2 along the first cell boundary CB1. The second cell boundary CB2 may be provided thereon with the second power line MPR2 to which is applied the source voltage VSS or ground voltage. For example, the second power line MPR2 to which the source voltage VSS is applied may extend in the second direction D2 along the second cell boundary CB2.

The first to fifth lower lines MI1 to MI5 may be located between the first power line MPR1 and the second power line MPR2. For example, first to fifth wiring tracks MTR1 to MTR5 may be defined between the first power line MPR1 and the second power line MPR2. The first to fifth wiring tracks MTR1 to MTR5 may extend in parallel to each other in the second direction D2. The first to fifth lower lines MI1 to MI5 may be arranged at a second pitch P2 along the first direction D1. The second pitch P2 may be less than the first pitch P1.

At least one first lower line MI1 may be located on the first wiring track MTR1, at least one second lower line MI2 may be located on the second wiring track MTR2, at least one third lower line MI3 may be located on the third wiring track MTR3, at least one fourth lower line MI4 may be located on the fourth wiring track MTR4, and at least one fifth lower line MI5 may be located on the fifth wiring track MTR5.

The first to fifth lower lines MI1 to MI5 may extend in parallel to each other in the second direction D2 along the first to fifth wiring tracks MTR1 to MTR5, respectively. When viewed in plan, each of the first to fifth lower lines MI1 to MI5 may have a linear or bar shape.

A first width W1 may be given as a line-width of each of the first and second power lines MPR1 and MPR2, which may or may not have the same width. A second width W2 may be given as a line-width of each of the first to fifth lower lines MI1 to MI5, which each may or may not have the same width. The second width W2 may be less than the first width W1 (see FIG. 2C). For example, the second width W2 may be less than about 12 nm. The first width W1 may be greater than about 12 nm.

The lower vias VI1 may be interposed between the active contacts AC and the first and second power lines MPR1 and MPR2. The lower vias VI1 may be interposed between the first to fifth lower lines MI1 to MI5 and the active and gate contacts AC and GC.

For example, the first and second power lines MPR1 and MPR2 and the first to fifth lower lines MI1 to MI5 may include metal selected from the group consisting of or including copper (Cu), aluminum (Al), ruthenium (Ru), cobalt (Co), tungsten (W), and molybdenum (Mo).

A certain one of the lines MPR1, MPR2, and MI1 to MI5 and its underlying lower via VI1 of the first metal layer M1 may be formed by individual processes. For example, the lines MPR1, MPR2, and MI1 to MI5 and the lower vias VI1 of the first metal layer M1 may each be formed by a single damascene process. A sub-20 nm process may be employed to fabricate a semiconductor device according to various example embodiments.

A second metal layer M2 may be provided in a fourth interlayer dielectric layer 140. The second metal layer M2 may include upper lines M2_I. Each of the upper lines M2_I may have a linear and/or bar shape that extends in the first direction D1. For example, the upper lines M2_I may extend in parallel to each other in or along the first direction D1.

The second metal layer M2 may further include upper vias VI2. The upper vias VI2 may be provided below the upper lines M2_I. The upper vias VI2 may be correspondingly interposed between the upper lines M2_I and the lines MPR1, MPR2, and MI1 to MI5 of the first metal layer M1.

The upper line M2_I and the respective underlying upper via VI2 of the second metal layer M2 may be formed into a single piece in the same process. For example, a dual damascene process may be employed to form the upper line M2_I simultaneously with the upper via VI2 of the second metal layer M2. The upper lines M2_I may include metal selected from the group consisting of or including copper (Cu), aluminum (Al), ruthenium (Ru), cobalt (Co), tungsten (W), and molybdenum (Mo).

In some example embodiments, although not shown, metal layers (e.g., M3, M4, M5, etc.) may be additionally stacked on the fourth interlayer dielectric layer 140. Each of the stacked metal layers may include routing lines.

Figure 3:
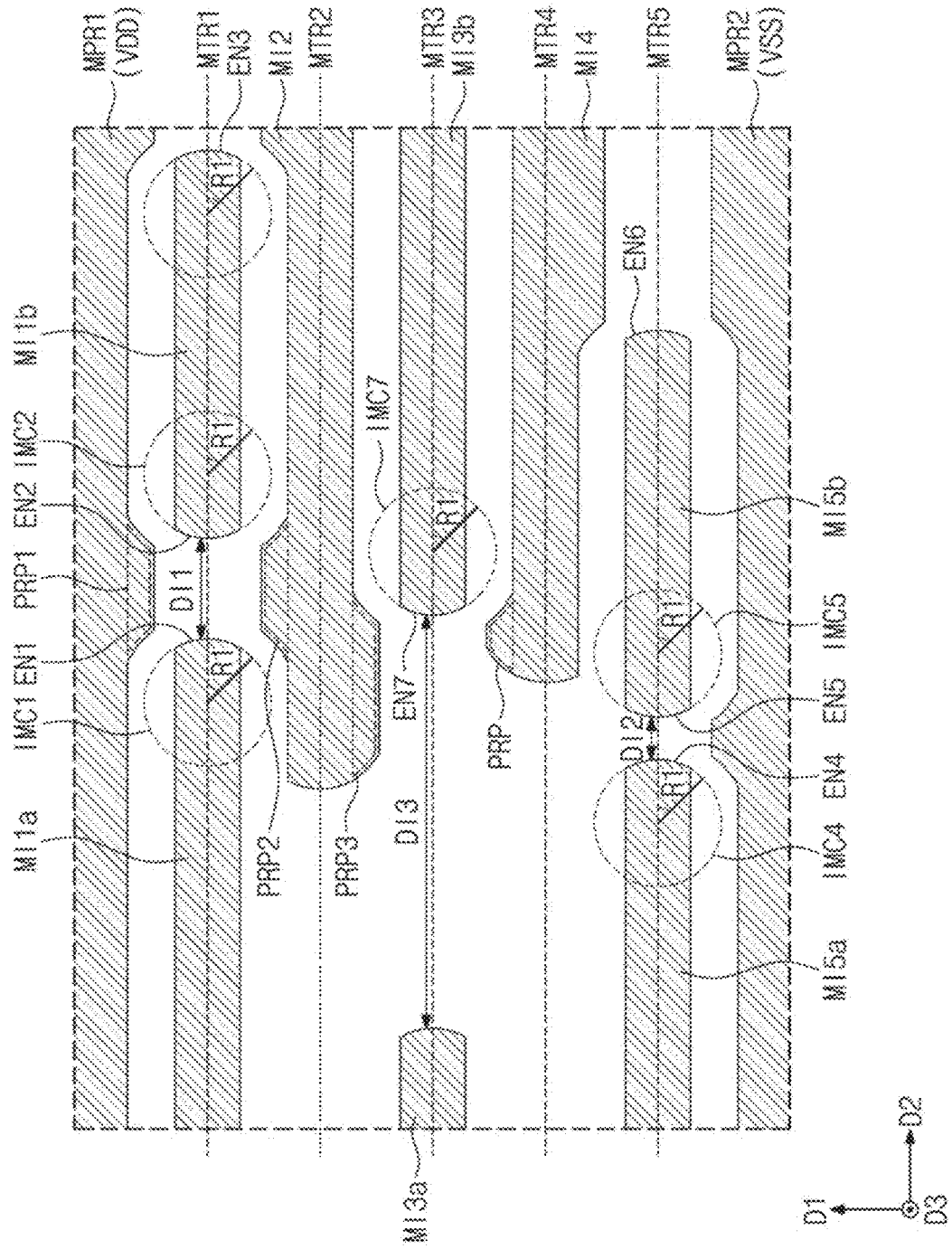
FIG. 3 illustrates a plan view showing first to fifth lower lines of FIG. 1 according to some example embodiments.

FIG. 3 illustrates a plan view showing first to fifth lower lines of FIG. 1. Referring to FIG. 3, the first lower lines MI1 located on the first wiring track MTR1 may include a first line MI1a and a second line MI1b. The first line MI1a and the second line MI1b may be arranged in the second direction D2 along the first wiring track MTR1.

The first line MI1a may have a first end EN1 at a tip thereof, and the second line MI1b may have a second end EN2 at a tip thereof. The first end EN1 of the first line MI1a and the second end EN2 of the second line MI1b may face each other in the second direction D2.

A first distance DI1 may be provided between the first end EN1 of the first line MI1a and the second end EN2 of the second line MI1b. The first distance DI1 may be a distance between the tip of the first line MI1a and the tip of the second line MI1b (i.e., tip to tip). The first distance DI1 may be greater a second distance DI2 which will be discussed below.

A curved profile, e.g. a curved profile in plan view, may be provided to the first end EN1 of the first line MI1a and the second end EN2 of the second line MI1b. A positive curvature may be given to the first end EN1 of the first line MI1a and the second end EN2 of the second line MI1b. For example, a first imaginary circle IMC1 may be defined at the first end EN1 of the first line MI1a. The first imaginary circle IMC1 may include an arc that corresponds to the first end EN1. For example, the first imaginary circle IMC1 may be a circle that is a best fit to a curve of the first end EN1. The first imaginary circle IMC1 may have a first radius R1. The first radius R1 may be a radius of curvature of the first end EN1 of the first line MI1a. The curvature may be reciprocal to the radius of curvature.

In some example embodiments, the second end EN2 of the second line MI1b may have a curvature and a radius of curvature substantially the same as those of the first end EN1 of the first line MI1a. For example, a second imaginary circle IMC2 that corresponds to the second end EN2 of the second line MI1b may have the first radius R1 the same as that of the first imaginary circle IMC1.

In some example embodiments, a third end EN3 of the second line MI1b may have a curvature and a radius of curvature substantially the same as those of the second end EN2 of the second line MI1b. For example, a third imaginary circle IMC3 that corresponds to the third end EN3 of the second line MI1b may have the first radius R1 the same as that of the second imaginary circle IMC2.

The fifth lower lines IM5 disposed on the fifth wiring track MTR5 may include a third line MI5a and a fourth line MI5b. The third line MI5a may have a fourth end EN4 at a tip thereof, and the fourth line MI5b may have a fifth end EN5 and a sixth end EN6 at opposite tips thereof. The fourth end EN4 of the third line MI5a and the fifth end EN5 of the fourth line MI5b may face each other in the second direction D2.

A second distance DI2 may be provided between the fourth end EN4 of the third line MI5a and the fifth end EN5 of the fourth line MI5b. The second distance DI2 may be a distance between the tip of the third line MI5a and the tip of the fourth line MI5b. The second distance DI2 may be less than the first distance DI1 on the first wiring track MTR1.

The fourth end EN4 of the third line MI5a may be curved, e.g. curved in plan view, and the fifth end EN5 of the fourth line MI5b may also be curved, e.g. curved in plan view. A positive curvature may be given to the fourth end EN4 of the third line MI5a and the fifth end EN5 of the fourth line MI5b. In some example embodiments, the fourth end EN4 of the third line MI5a may have a curvature and a radius of curvature substantially the same as those of the first end EN1 of the first line MI1a. The fifth end EN5 of the fourth line MI5b may have a curvature and a radius of curvature substantially the same as those of the first end EN1 of the first line MI1a.

For example, a fourth imaginary circle IMC4 may be defined at the fourth end EN4 of the third line MI5a. The fourth imaginary circle IMC4 may include an arc that corresponds to the fourth end EN4. The fourth imaginary circle IMC4 may have the first radius R1 the same as that of the first imaginary circle IMC1. A fifth imaginary circle IMC5 that corresponds to the fifth end EN5 of the fourth line MI5b may have the first radius R1 the same as that of the fourth imaginary circle IMC4.

According to some example embodiments, identical to the second line MI1b discussed above, a sixth end EN6 of the fourth line MI5b may have a curvature and a radius of curvature substantially the same as those of the fifth end EN5 of the fourth line MI5b.

The third lower lines MI3 located on the third wiring track MTR3 may include a fifth line MI3a and a sixth line MI3b. The sixth line MI3b may have a seventh end EN7 at a tip thereof. A seventh end EN7 of the sixth line MI3b may face the fifth line MI3a. A third distance DI3 may be provided between the fifth line MI3a and the sixth line MI3b. The third distance DI3 may be a distance between the tip of the fifth line MI3a and the tip of the sixth line MI3b. The third distance DI3 may be less than the first distance DI1 on the first wiring track MTR1.

The seventh end EN7 of the sixth line MI3b may be curved, e.g. curved in plan view. In some example embodiments, the seventh end EN7 of the sixth line MI3b may have a curvature and a radius of curvature substantially the same as those of the first end EN1 of the first line MI1a. For example, a seventh imaginary circle IMC7 may be defined at the seventh end EN7 of the sixth line MI3b. The seventh imaginary circle IMC7 may include an arc that corresponds to the seventh end EN7. The seventh imaginary circle IMC7 may have the first radius R1 the same as that of the first imaginary circle IMC1.

The first distance DI1 and the second distance DI2 may correspond to a specific or design or critical distance between lines, e.g. a distance that may be measured with a critical dimension scanning-electron microscope (CD-SEM). For example, the critical distance may be an interval such as a minimum interval between lines that can be implemented within the limitation of wiring process. For general semiconductor fabrication process, the critical distance of a certain layer may have one fixed value, e.g. one fixed design value. The specific or critical distances may be design parameters and may be associated with the technology used in the fabrication of the semiconductor device. For example, the specific or critical distances may be specific or critical dimensions (CD's).

According to some example embodiments, there may be a large variation in tip-to-tip distance, and/or in an interval between lines disposed on the same wiring track. In some example embodiments, the specific or critical distance may not have a fixed value, but may instead have various values (e.g., DI1 and DI2). For example, each of the first distance DI1 and the second distance DI2 according to some example embodiments may have a value ranging from about 24 nm to about 60 nm, which is the value of the specific or critical distance of the first metal layer M1. As shown in FIG. 3, there may be two cases, DI1 and DI2, of the specific or critical distance of the first metal layer M1 according to some example embodiments.

As a comparative example, a line has at its tip a curvature that is changed based on the tip-to-tip distance between lines disposed on the same wiring track. For example, the first and second ends EN1 and EN2 that are spaced apart from each other at the first distance DI1 may have their curvatures different from those of the fourth and fifth ends EN4 and EN5 that are spaced apart from each other at the second distance DI2 different from (greater than or less than) the first distance DI1. This may be because a line fabrication process is changed based on the tip-to-tip distance between lines. Alternatively or additionally, this may be because the degree of light interference in photolithography is changed based on the tip-to-tip distance between lines.

In contrast, according to some example embodiments, a curvature at a tip may be always the same regardless of the tip-to-tip distance between lines. For example, according to some example embodiments, the same process may be used to simultaneously form the first and second lines MI1a and MI1b that are spaced apart from each other at the first distance DI1 and the third and fourth lines MI5a and MI5b that are spaced apart from each other at the second distance DI2. According to some example embodiments, curvatures at tips may be the same as each other because the tips of the first and second lines MI1a and MI1b and the tips of the third and fourth lines MI5a and MI5b are not formed by a photolithography process, but formed by an elongation etching process which will be discussed below.

The first power line MPR1 adjacent to the first wiring track MTR1 may include a first serif or first protrusion PRP1 that protrudes toward a first region between the first end EN1 of the first line MI1a and the second end EN2 of the second line MI1b. The first protrusion PRP1 may be concave at its opposite sidewalls that correspond to the first end EN1 and the second end EN2.

The second lower line MI2 may be provided on the second wiring track MTR2. The second lower line MI2 may include a second serif or second protrusion PRP2 that protrudes toward a second region between the first end EN1 and the second end EN2. The second protrusion PRP2 and the first protrusion PRP1 may be symmetric with each other about the first wiring track MTR1.

The second lower line MI2 may further include a third serif or third protrusion PRP3 on a location opposite to that of the second protrusion PRP2. The third protrusion PRP3 may have a concave sidewall that corresponds to the seventh end EN7 of the sixth line MI3b. The fourth lower line MI4 on the fourth wiring track MTR4 may also include a protrusion PRP.

The protrusion PRP may cause a variation in line-width of each of the first and second power lines MPR1 and MPR2 and each of the second and fourth lower lines MI2 and MI4. A line-width of each of the first, third, and fifth lower lines MI1, MI3, and MI5 may be constant without being changed, except an end or a tip thereof. This may be because that the protrusion PRP is not included in any of the first, third, and fifth lower lines MI1, MI3, and MI5, differently from the second and fourth lower lines MI2 and MI4.

In some example embodiments, the second and fourth lower lines MI2 and MI4 may have their tips whose curvature is different from that of the tips of the first, third, and fifth lower lines MI1, MI3, and MI5. This may be because that the second and fourth lower lines MI2 and MI2 are formed by a photolithography process different from that used for forming the first, third, and fifth lower lines MI1, MI3, and MI5.

Figure 4:
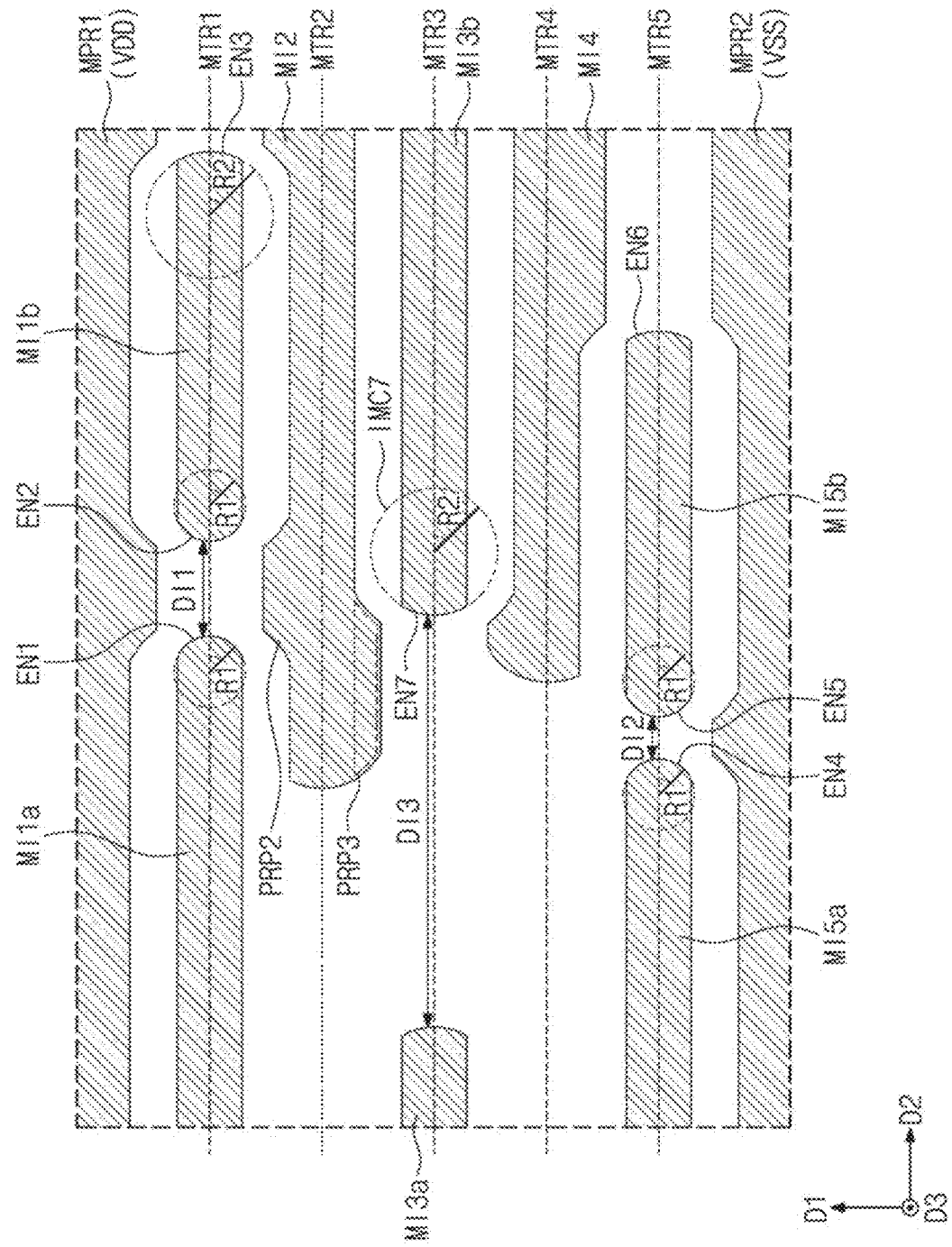
FIG. 4 illustrates a plan view showing first to fifth lower lines of FIG. 1 according to some example embodiments.

FIG. 4 illustrates a plan view showing first to fifth lower lines of FIG. 1 according to some example embodiments. In embodiments that follows, a detailed description of technical features repetitive to those discussed above with reference to FIG. 3 will be omitted, and a difference thereof will be discussed in detail.

The first end EN1 of the first line MI1a may have a curvature substantially the same as that of the second end EN2 of the second line MI1b. Each of the first and second ends EN1 and EN2 may have a first radius of curvature/curvature radius R1.

The third end EN3 of the second line MI1b may have a curvature different from that of the second end EN2 of the second line MI1b. The third end EN3 of the second line MI1b may have a second curvature radius R2. The second curvature radius R2 may be greater than the first curvature radius R1. For example, the curvature at the third end EN3 of the second line MI1b may be less than the curvature at the second end EN2 of the second line MI1b, which second end EN2 is located opposite to the third end EN3. According to some example embodiments, one line may have different curvatures at opposite ends thereof.

The fourth end EN4 of the third line MI5a may have a curvature substantially the same as that of the fifth end EN5 of the fourth line MI5b. The curvature at each of the fourth and fifth ends EN4 and EN5 may be substantially the same as that at the first end EN1. Each of the fourth and fifth ends EN4 and EN4 may have the first curvature radius R1. The sixth end EN6 of the fourth line MI5b may have a curvature different from that of the fifth end EN5.

The seventh end EN7 of the sixth line MI3b may have a curvature different from that of the first end EN1 of the first line MI1a. For example, the seventh end EN7 of the sixth line MI3b may have a second curvature radius R2 greater than the first curvature radius R1 of the first end EN1. The curvature at the seventh end EN7 of the sixth line MI3b may be substantially the same as that at the third end EN3 of the second line MI1b.

A third distance DI3 between the fifth line MI3a and the seventh end EN7 of the sixth line MI3b may be significantly greater than the first distance DI1 and the second distance DI2. Different from or alternative to the first distance DI1 and the second distance DI2, the third distance DI3 may not be the critical distance of the first metal layer M1. In this case, the curvature at the seventh end EN7 may be less than the curvature at each of the first, second, fourth, and fifth ends EN1, EN2, EN4, and EN5.

FIGS. 5, 7, 9, 11, 13, 15, 17, and 19 are plan views showing a method of forming a first metal layer according to some example embodiments. FIGS. 6A, 8A, 10A, 12A, 14A, 16A, 18A, and 20A illustrate cross-sectional views taken along line I-I' of FIGS. 5, 7, 9, 11, 13, 15, 17, and 19, respectively. FIGS. 6B, 8B, 10B, 12B, 14B, 16B, 18B, and 20B illustrate cross-sectional views taken along line II-IF of FIGS. 5, 7, 9, 11, 13, 15, 17, and 19, respectively. A method of forming a first metal layer according to some example embodiments may relate to a damascene process in which an engraved portion of an interlayer dielectric layer is filled with metal to form a wiring line.

Figure 5:
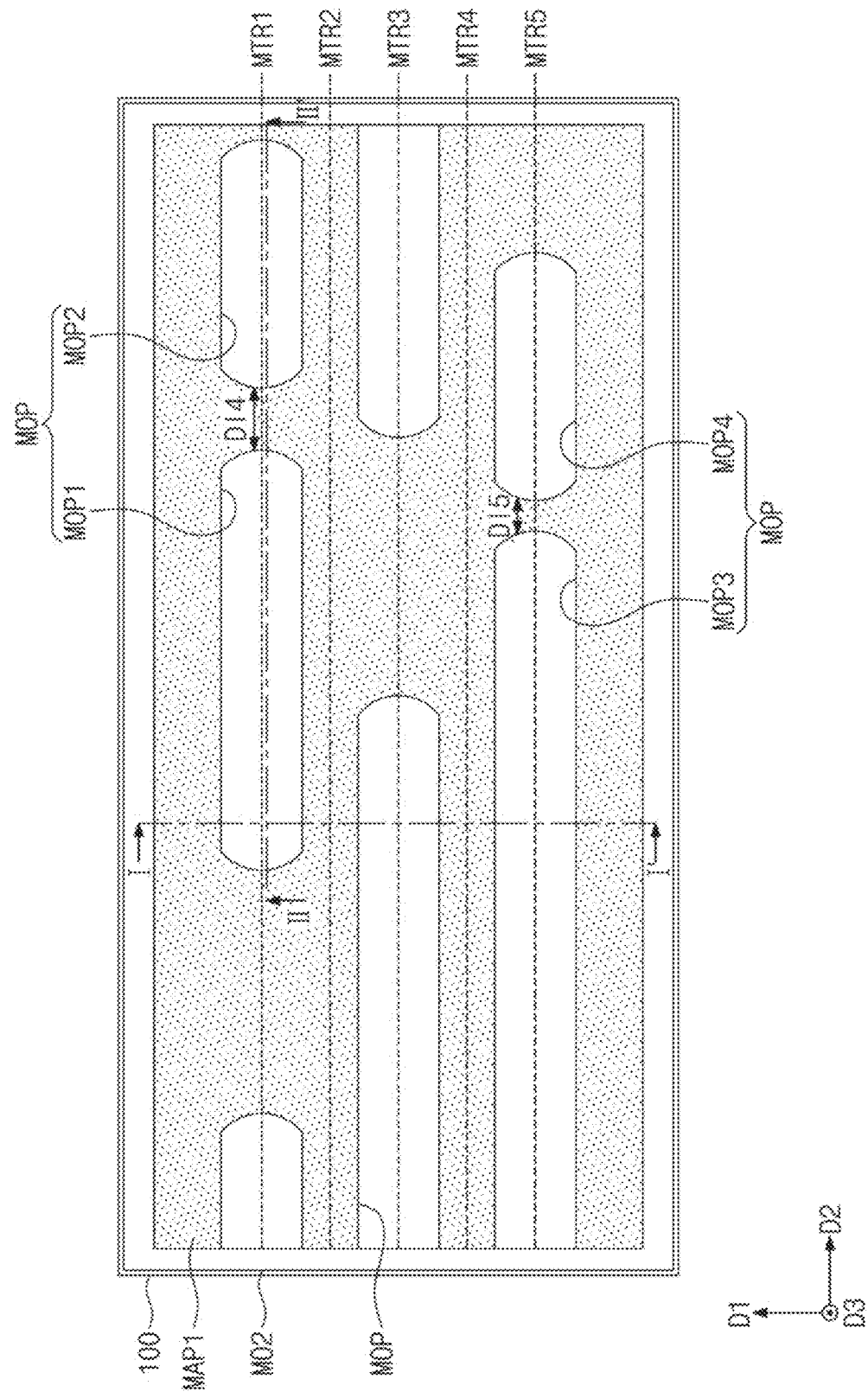
FIGS. 5, 7, 9, 11, 13, 15, 17, and 19 are plan views showing a method of forming a first metal layer according to some example embodiments.
Figure 6A:
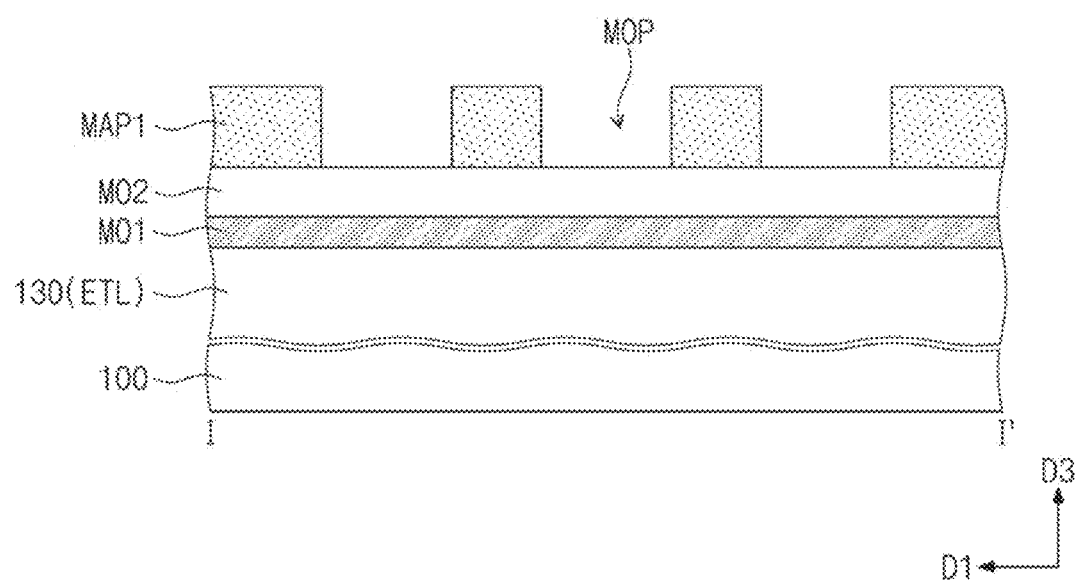
FIGS. 6A, 8A, 10A, 12A, 14A, 16A, 18A, and 20A illustrate cross-sectional views taken along line I-I' of FIGS. 5, 7, 9, 11, 13, 15, 17, and 19, respectively.
Figure 6B:
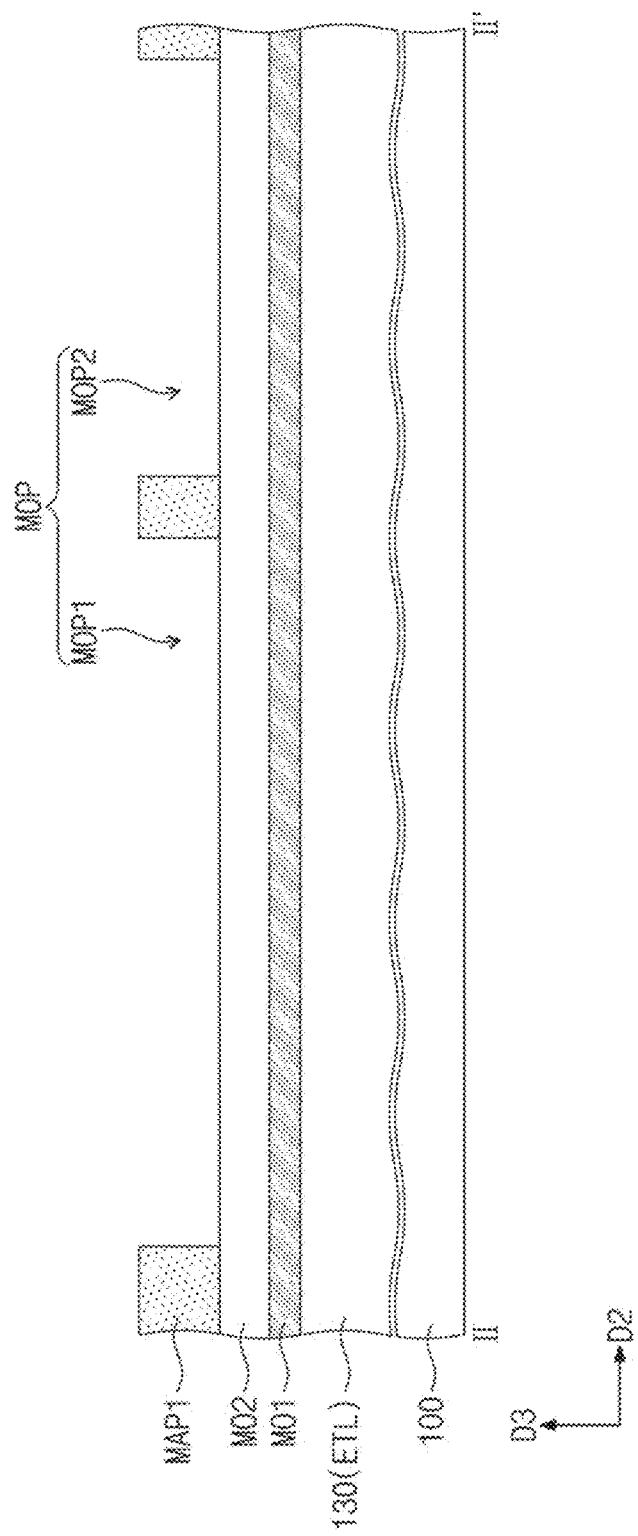
FIGS. 6B, 8B, 10B, 12B, 14B, 16B, 18B, and 20B illustrate cross-sectional views taken along line II-IF of FIGS. 5, 7, 9, 11, 13, 15, 17, and 19, respectively.

Referring to FIGS. 5, 6A, and 6B, on a substrate 100 a plurality of logic transistors discussed above with reference to FIGS. 1 and 2A to 2D may be formed. Although not shown in FIGS. 6A and 6B, detailed structures of the logic transistors may be the same as those illustrated in FIGS. 2A to 2D.

A third interlayer dielectric layer 130 may be formed on the logic transistors. The third interlayer dielectric layer 130 may be an etch-target layer ETL. A first mold layer MO1 and a second mold layer MO2 may be sequentially formed on the etch-target layer ETL. The first mold layer MO1 may include a metal nitride layer, such as a titanium nitride (TiN) layer and/or a tantalum nitride (TaN) layer. The second mold layer MO2 may include a silicon-containing dielectric layer, such as a silicon oxide layer and/or a silicon oxynitride layer.

A first mask pattern MAP1 may be formed on the second mold layer M02. The first mask pattern MAP1 may be formed by a first photolithography process that uses a first photomask. The first photolithography process may use one or more of a KrF light source, an ArF light source, or an EUV light source; however, example embodiments are not limited thereto.

The formation of the first mask pattern MAP1 may include, for example, forming a mask layer on the second mold layer M02, performing on the mask layer the first photolithography process to form a first photoresist patterns, and using the first photoresist pattern as an etching mask to pattern the mask layer. The first mask pattern MAP1 may serve as a mandrel in a multi-patterning technique (MPT). The first mask pattern MAP1 may include, for example, amorphous silicon.

The first mask pattern MAP1 may include primary openings MOP. Each of the primary openings MOP may expose a top surface of the second mold layer M02. Each of the primary openings MOP may be formed to extend in parallel to each other in a second direction D2. The primary openings MOP may be formed to align with first, third, and fifth wiring tracks MTR1, MTR3, and MTR5. The primary openings MOP may not be formed on any of second and fourth wiring tracks MTR2 and MTR4. The primary openings MOP may define locations where first, third, and fifth lower lines MI1, MI3, and MI5 will be formed.

For example, the primary openings MOP on the first wiring track MTR1 may include a first opening MOP1 and a second opening MOP2 that are adjacent to each other in the second direction D2. The first opening MOP1 and the second opening MOP2 may be spaced apart from each other at a fourth distance DI4.

The primary openings MOP on the fifth wiring track MTR5 may include a third opening MOP3 and a fourth opening MOP4 that are adjacent to each other in the second direction D2. The third opening MOP3 and the fourth opening MOP4 may be spaced apart from each other at a fifth distance DI5. The fifth distance DI5 may be less than the fourth distance DI4. For example, there may be a large variation in an interval between neighboring primary openings MOP according to various example embodiments.

Figure 7:
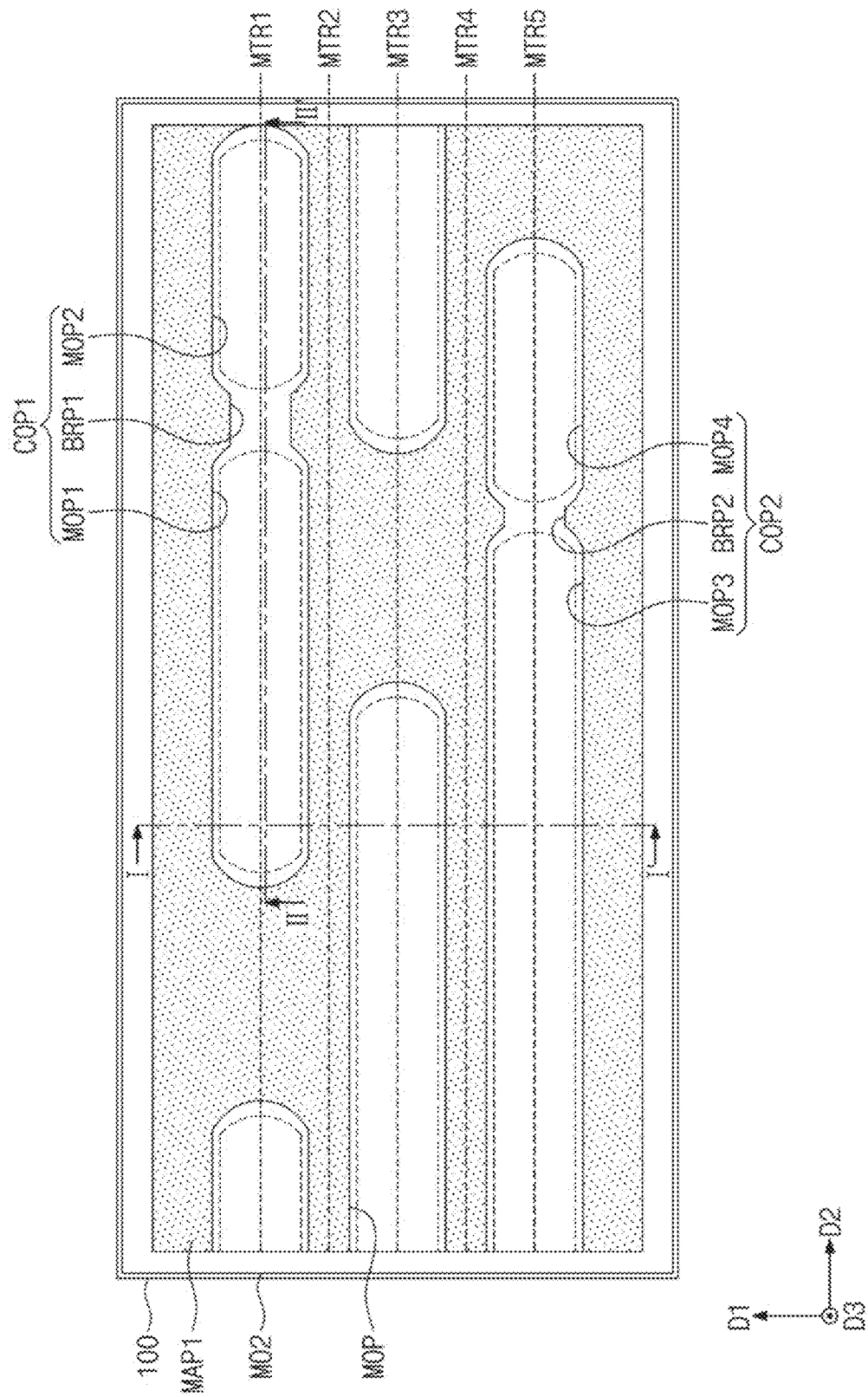
Figure 8A:
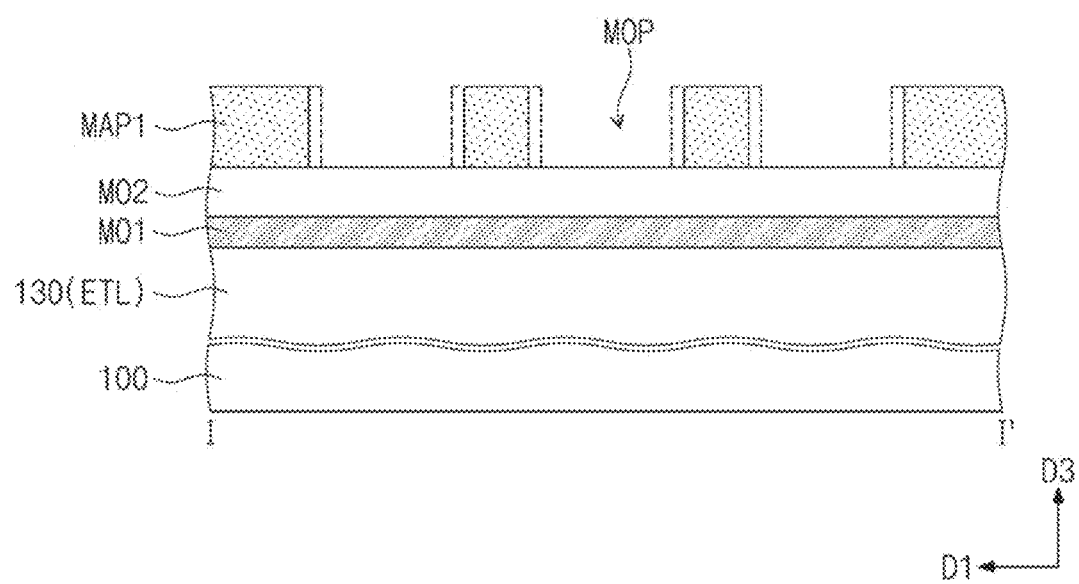
Figure 8B:
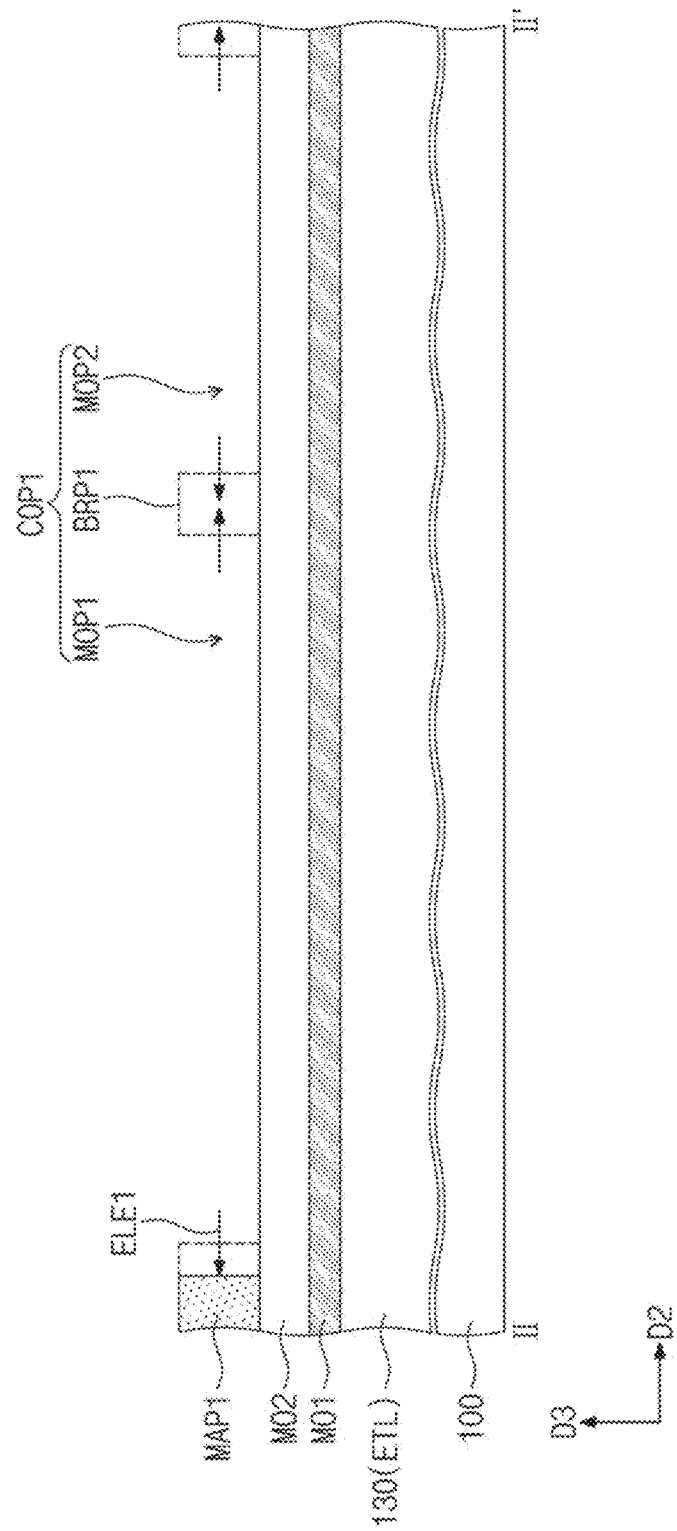

Referring to FIGS. 7, 8A, and 8B, the first mask pattern MAP1 may undergo a first elongation etching process ELE1 to horizontally expand the primary openings MOP. The first elongation etching process ELE1 may have directionality or anisotropy in a direction parallel to the second direction D2. During the first elongation etching process ELE1, the first mask pattern MAP1 may have an etch rate in a direction parallel to the second direction D2 of the first mask pattern MAP1 greater than an etch rate in a direction parallel to a first direction D1.

During the first elongation etching process ELE1, the primary opening MOP of the first mask pattern MAP1 may expand in a direction parallel to the second direction D2. For example, during the first elongation etching process ELE1, there may be no or almost no increase in width in the first direction D1 of the primary opening MOP. On the other side, during the first elongation etching process ELE1, there may an increase in width in the second direction D2 of the primary opening MOP.

The first elongation etching process ELE1 may be performed such that the first opening MOP1 and the respective adjacent second opening MOP2 are integrally connected into a single first connection opening COP1. The first opening MOP1 and the second opening MOP2 may be horizontally expanded to meet each other or be bridged with each other. The first opening MOP1 and the second opening MOP2 may be horizontally expanded to form a first bridge part BRP1. The first opening MOP1, the second opening MOP2, and the first bridge part BRP1 may constitute the first connection opening COP1.

The first elongation etching process ELE1 may be performed such that the third opening MOP3 and the respective adjacent fourth opening MOP4 are integrally connected into a single second connection opening COP2. The third opening MOP3 and the fourth opening MOP4 may be horizontally expanded to form a second bridge part BRP2. The third opening MOP3, the fourth opening MOP4, and the second bridge part BRP2 may constitute the second connection opening COP2.

As a comparative example, when the first photolithography process is performed to directly form a connection opening COP, a fine bottleneck-shaped bridge part BRP may not be normally formed. Alternatively or additionally, in the case of a light source with a small amount of photons, such as with EUV photolithography, a shape of the bridge part BRP may be arbitrarily changed such that the connection opening COP may not be exactly or specifically formed to have a desired shape. As a result, according to the comparative example, process defects may be more easily generated to reduce reliability of and/or yield of devices.

However, according to some example embodiments, the first elongation etching process ELE1 may merge neighboring primary openings MOP with each other, and thus it may be possible to form the connection opening COP that includes the bottleneck-shaped bridge part BRP. As shown above in FIG. 5, even when intervals between neighboring primary openings MOP are different from each other (e.g., the fourth distance DI4 and the fifth distance DI5), the first elongation etching process ELE1 may cause neighboring primary openings MOP to merge with each other without defects. This may be because control accuracy is greater in an etching process according to various example embodiments than in a photolithography process according to the comparative examples.

In conclusion, according to some example embodiments, it may be possible to stably form the connection opening COP that includes the bridge part BRP having a certain width in the first direction D1. For example, the bridge parts BRP of the connection openings COP may have substantially the same widths in the first direction D1.

Figure 9:
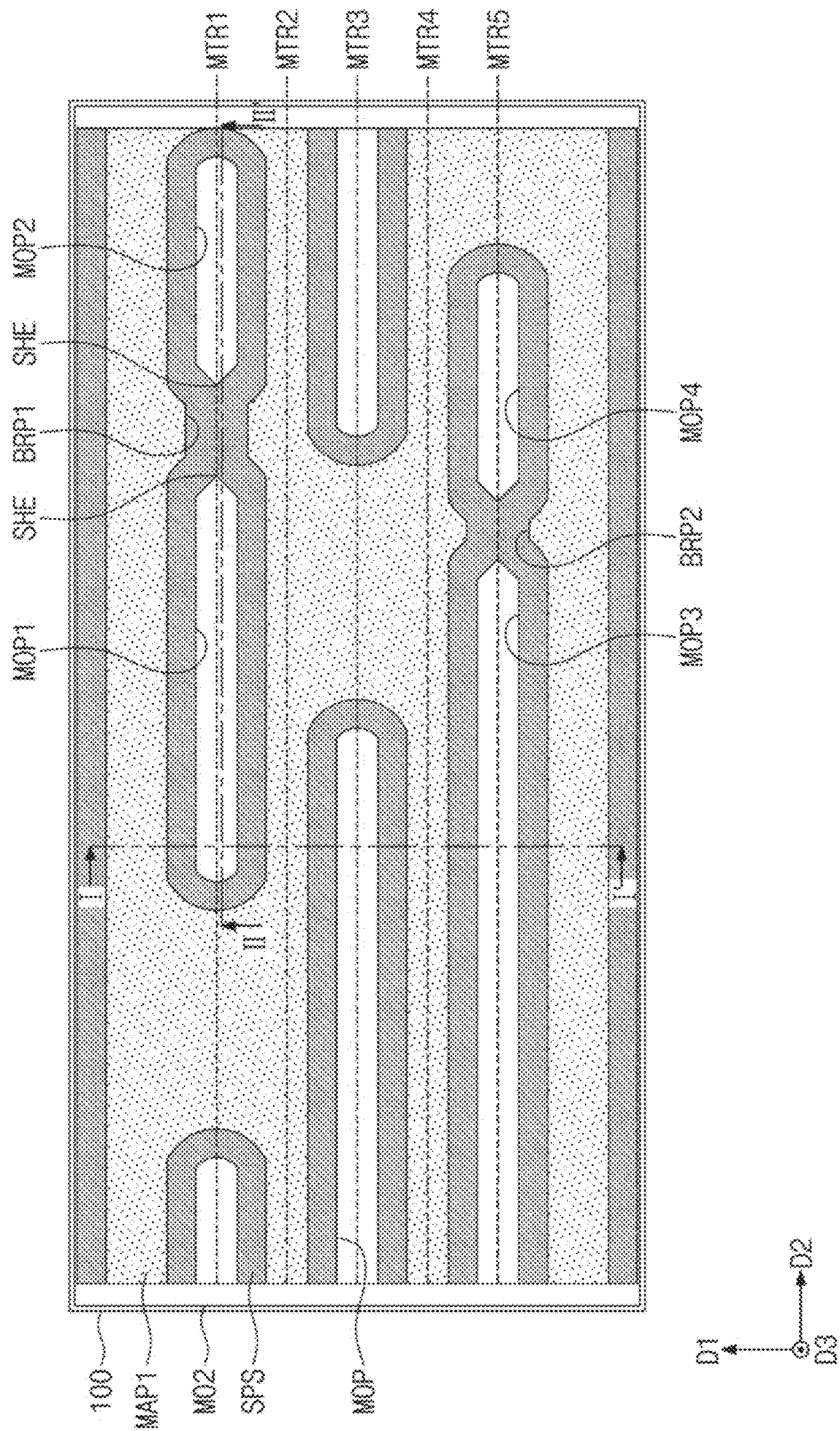
Figure 10A:
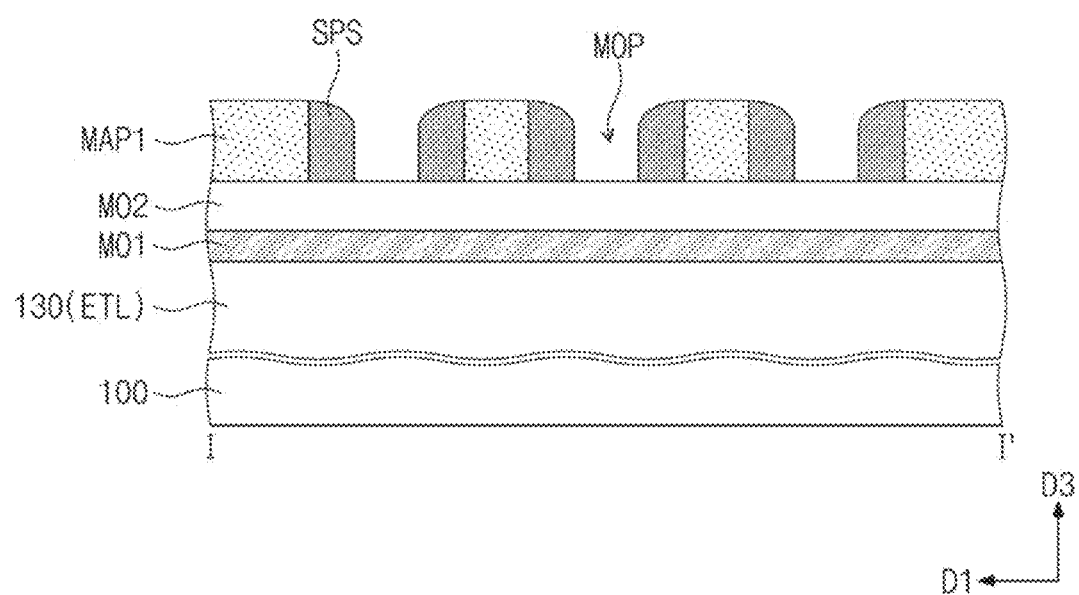
Figure 10B:
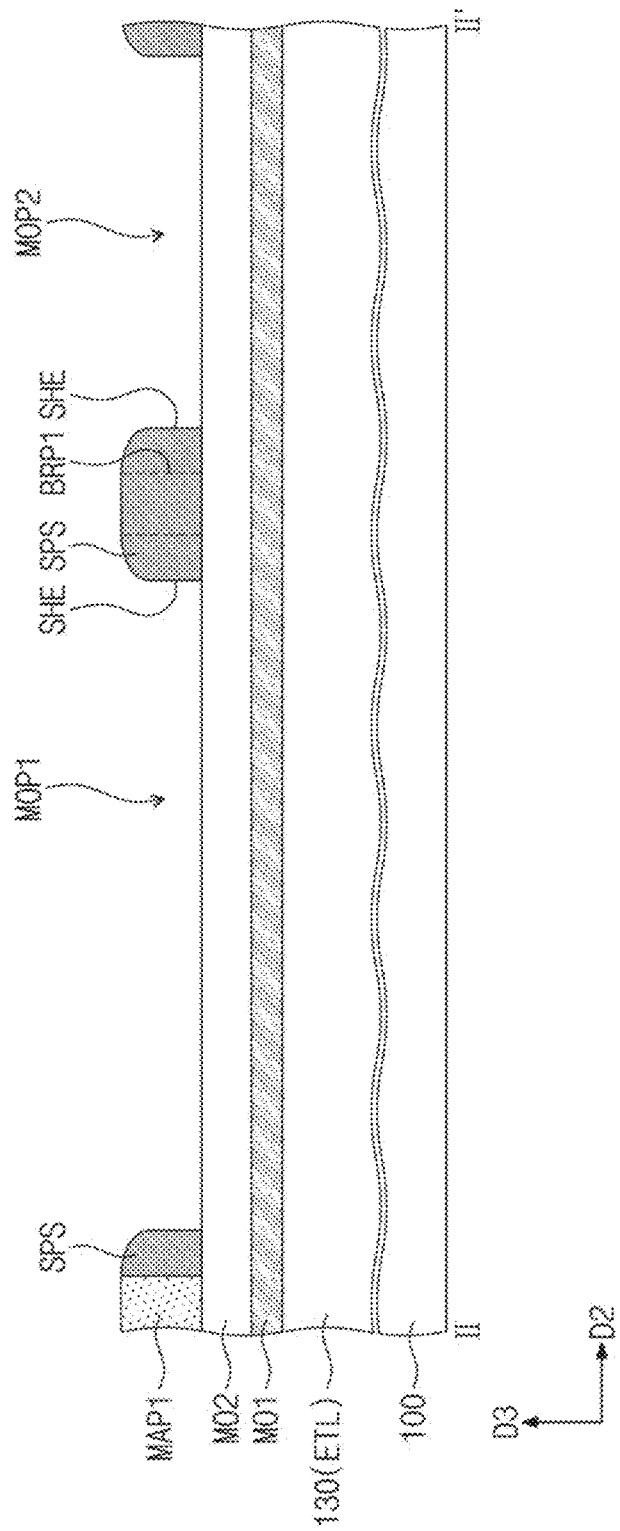

Referring to FIGS. 9, 10A, and 10B, spacers SPS may be formed on the first mask pattern MAP1, e.g. with an atomic layer deposition (ALD) process. The spacer SPS may be formed on an inner sidewall of the primary opening MOP of the first mask pattern MAP1. When viewed in plan, each of the spacers SPS may be conformally formed along the inner sidewall of the primary opening MOP. The spacer SPS may have a planar shape that conforms to a profile of the inner wall of the primary opening MOP.

The formation of the spacers SPS may include, for example, forming a spacer layer on the first mask pattern MAP1 and anisotropically etching the spacer layer until a top surface of the first mask pattern MAP1 is exposed or a top surface of the second mold layer MO2 is exposed. For example, the spacer layer may include titanium oxide.

The spacer SPS formed in the connection opening COP may completely fill the bridge part BRP. For example, the spacer SPS formed in the first connection opening COP1 may completely fill the first bridge part BRP1, and thus the first opening MOP1 and the second opening MOP2 may be spaced apart from each other across the spacer SPS.

Because a width in the first direction D1 of the first bridge part BRP1 is less than that of each of or either of the first and second openings MOP1 and MOP2, the first bridge part BRP1 may be completely filled with the spacer SPS while the spacer layer is deposited. The first and second openings MOP1 and MOP2 may each be formed to have a sharp edge SHE due to deposition properties of the spacer layer.

The second bridge part BRP2 may also be filled with the spacer SPS, and thus the third opening MOP3 and the fourth opening MOP4 may be spaced apart from each other across the spacer SPS.

Figure 11:
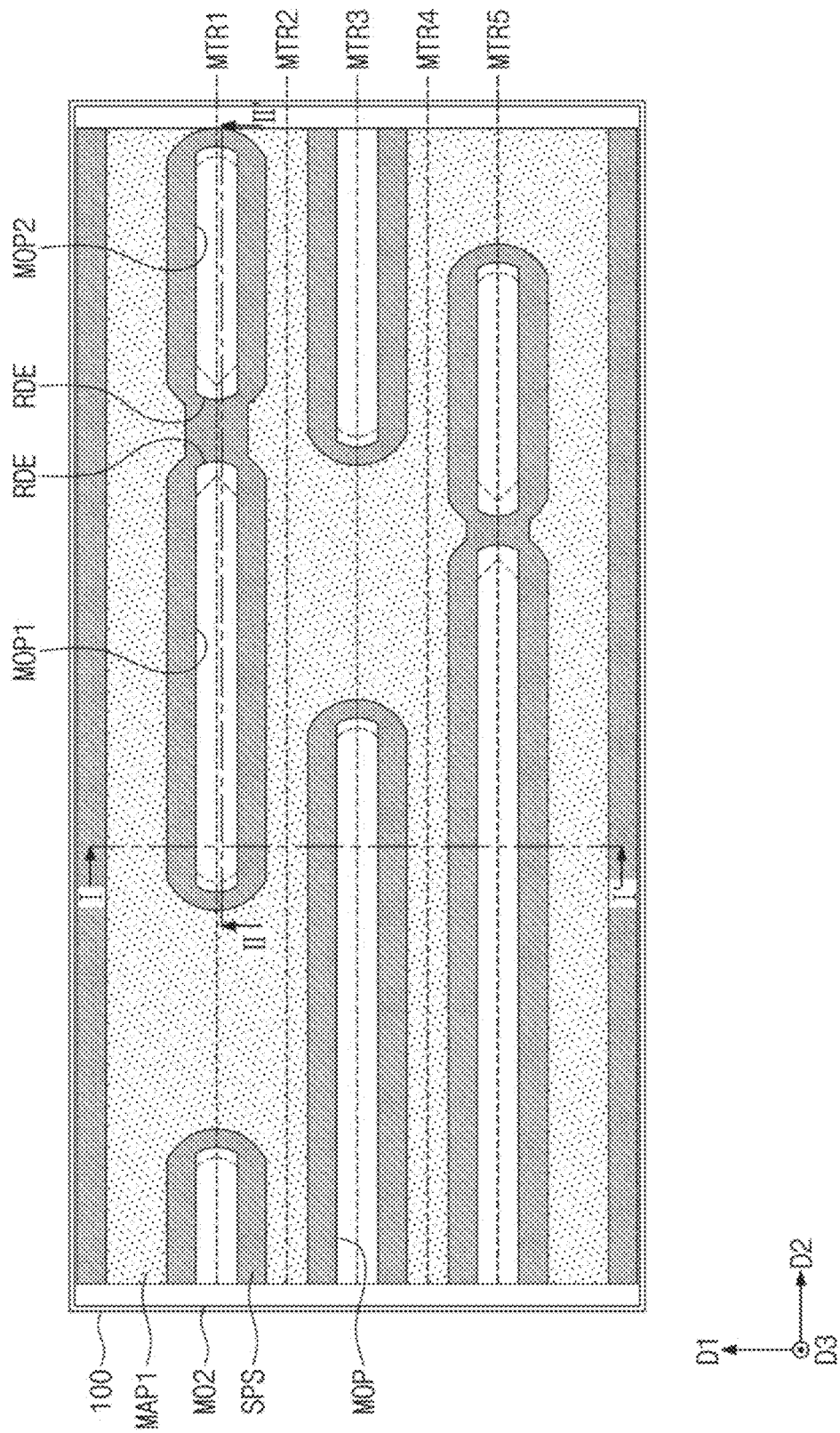
Figure 12A:
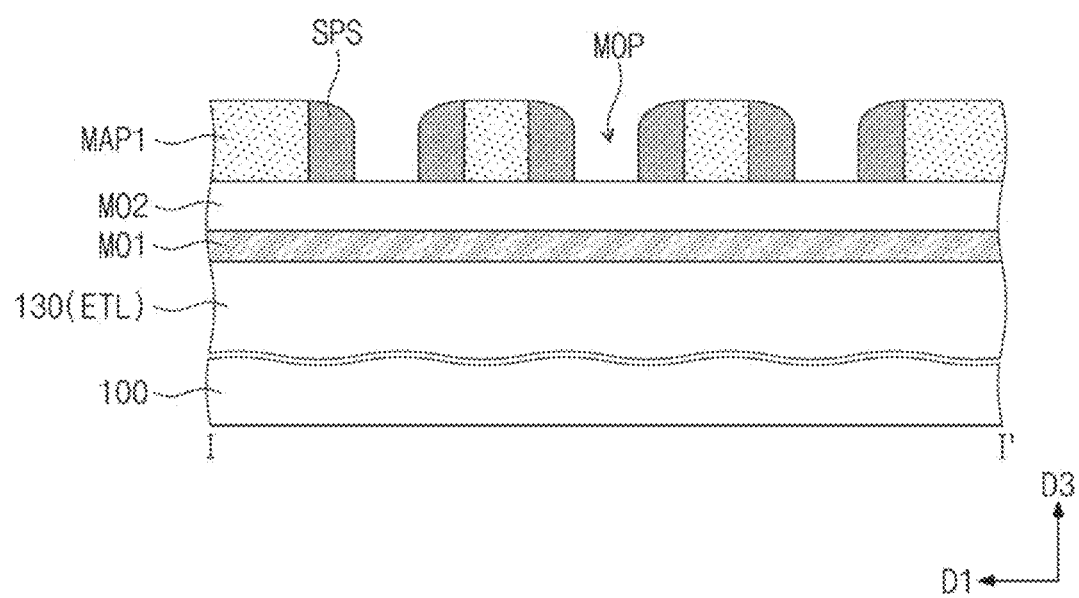
Figure 12B:
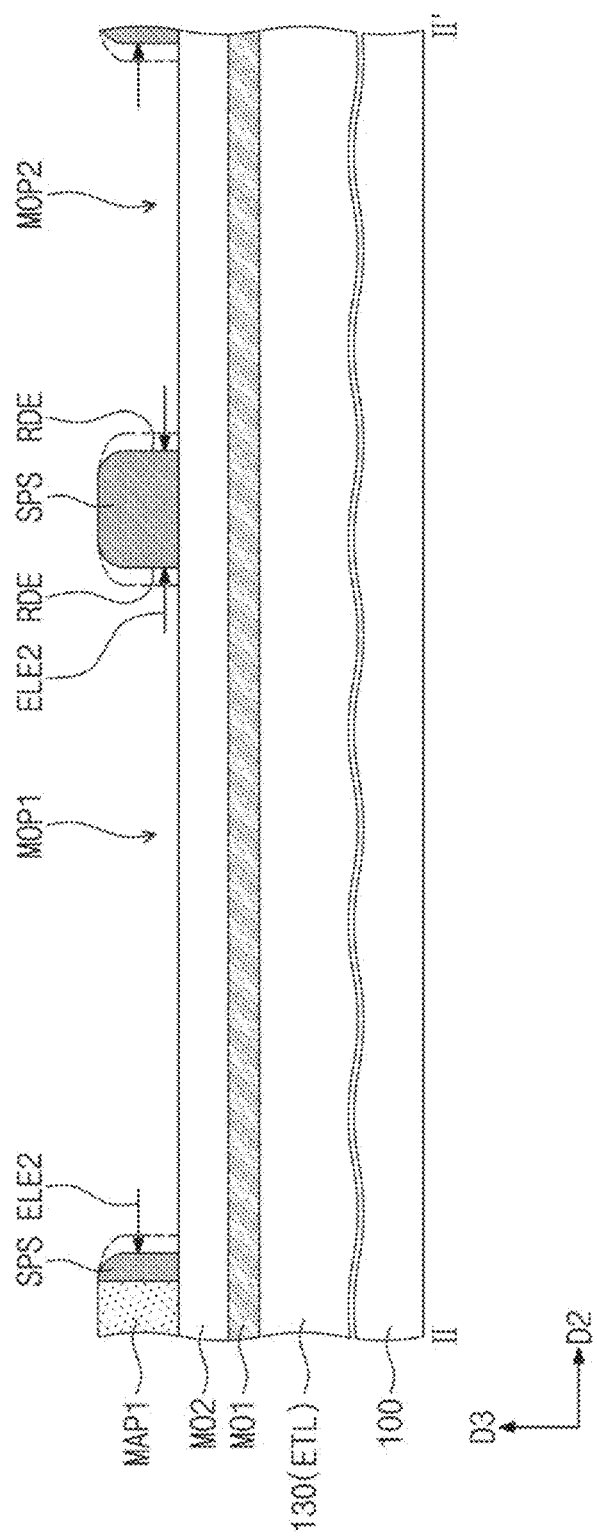

Referring now to FIGS. 11, 12A, and 12B, the spacer SPS may undergo a second elongation etching process ELE2 to further horizontally expand the primary opening MOP surrounded by the spacer SPS. Identical to the first elongation etching process ELE1, the second elongation etching process ELE2 may have directionality in the second direction D2. During the second elongation etching process ELE2, the spacer SPS may have an etch rate in a direction parallel to the second direction D2 greater than an etch rate in a direction parallel to the first direction D1.

For example, the second elongation etching process ELE2 may cause opposite ends of the first opening MOP1 to further horizontally extend. The second elongation etching process ELE2 may cause that a sharp edge SHE of each of the first and second openings MOP1 and MOP2 is changed into a rounded edge RDE.

When a line has a sharp edge at one end thereof, process defects such as an incomplete filling of metal in the sharp edge and/or a connection between the edge and its adjacent line may more easily occur. According to some example embodiments, the second elongation etching process ELE2 may cause the primary opening MOP to have rounded edges at its opposite ends or tips. Because the opposite ends of each of the primary openings MOP are simultaneously formed through the second elongation etching process ELE2, as discussed above with reference to FIG. 3, lines may have the same curvature at tips thereof.

According to some example embodiments, the second elongation etching process ELE2 may determine an interval between neighboring openings. For example, the second elongation etching process ELE2 may determine an interval (or, tip-to-tip distance) between the first opening MOP1 and the second opening MOP2.

As discussed above, because control accuracy is greater in an etching process than in a photolithography process, some example embodiments may more precisely adjust a tip-to-tip distance between lines. Alternatively or additionally, some example embodiments may accomplish a large variation in the tip-to-tip distance between lines.

Figure 13:
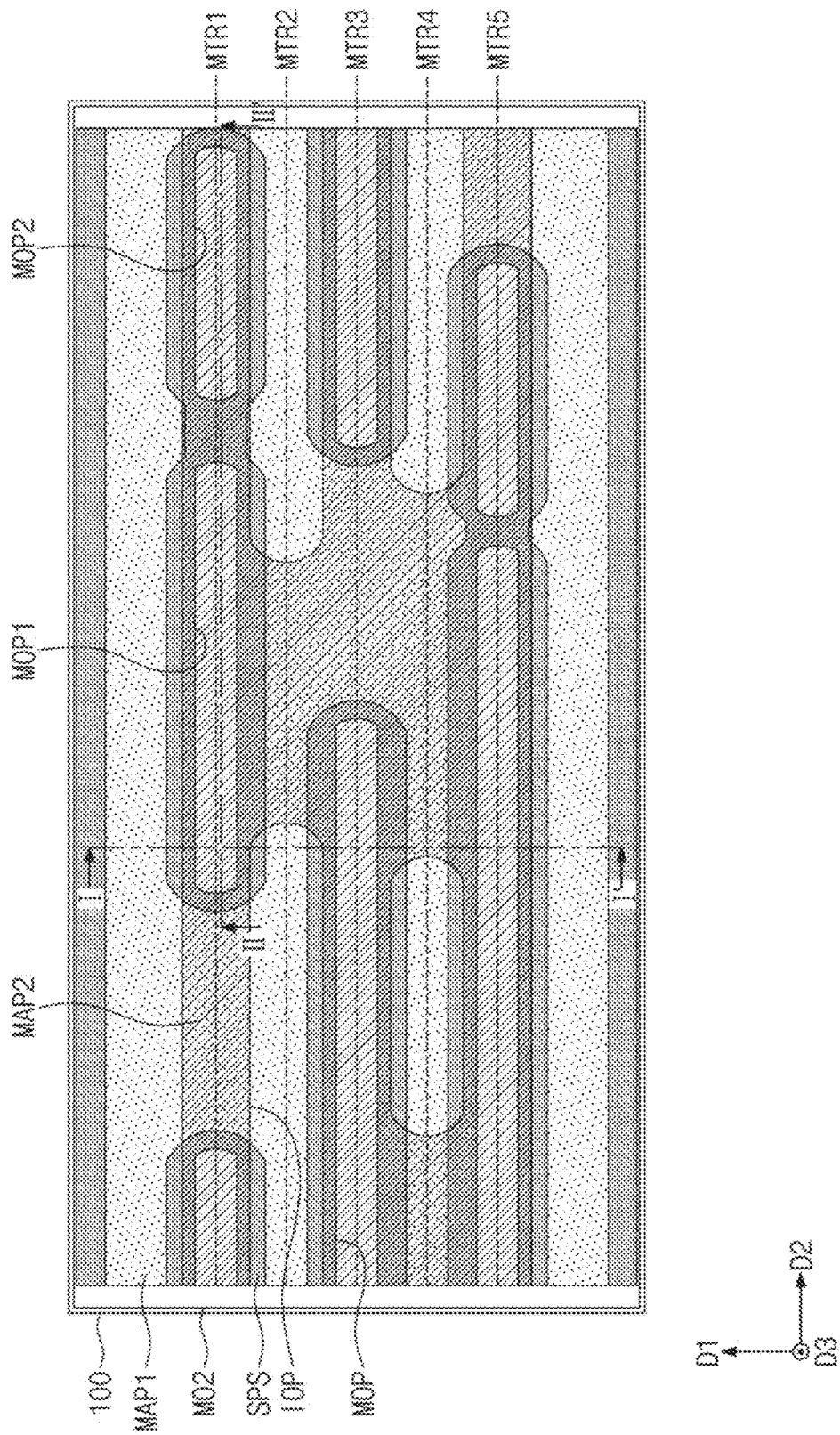
Figure 14A:
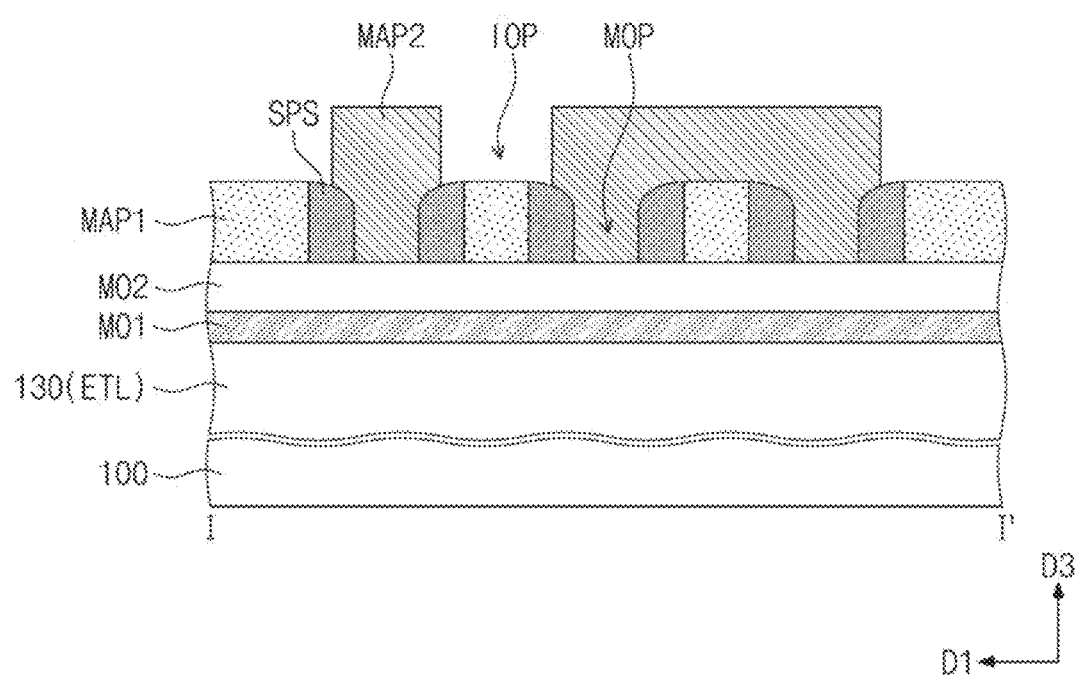
Figure 14B:
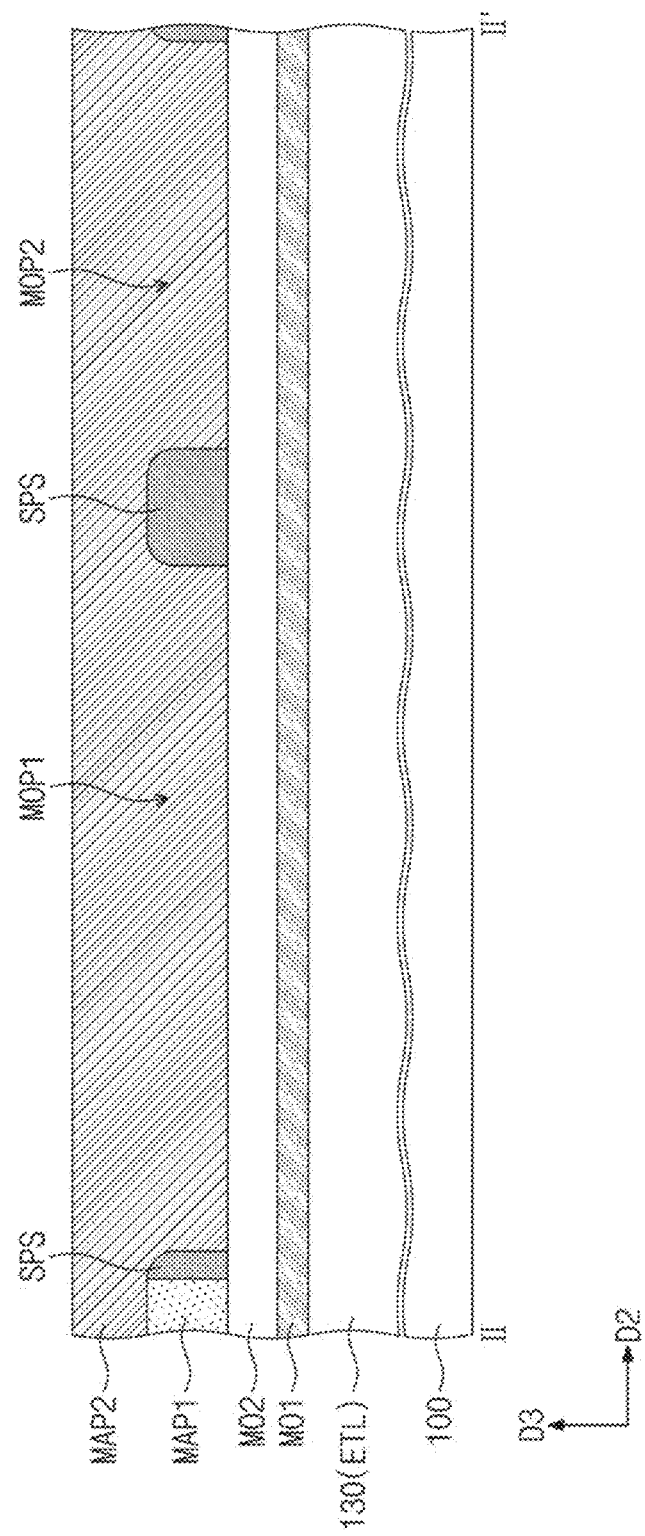

Referring to FIGS. 13, 14A, and 14B, a second mask pattern MAP2 may be formed on the second mold layer M02. The second mask pattern MAP2 may be formed by a second photolithography process that uses a different, second photomask. The second mask pattern MAP2 may serve as a second mask in a multi-patterning technique (MPT) according to some example embodiments.

The second mask pattern MAP2 may include secondary openings IOP. Each of the secondary openings IOP may expose the top surface of the first mask pattern MAP1. Each of the secondary openings IOP may expose a portion of the spacer SPS.

The secondary openings IOP may be formed to extend in parallel to each other in the second direction D2. The secondary openings IOP may be formed to align with the second and fourth wiring tracks MTR2 and MTR4 and a power track. The secondary openings IOP may not be formed on any of the first, third, and fifth wiring tracks MTR1, MTR3, and MTR5. For example, the secondary openings IOP may be offset in the first direction D1 from the primary openings MOP. The secondary openings IOP may define locations where first and second power lines MPR1 and MPR2 will be formed and second and fourth lower lines MI2 and MI4 will be formed.

Figure 15:
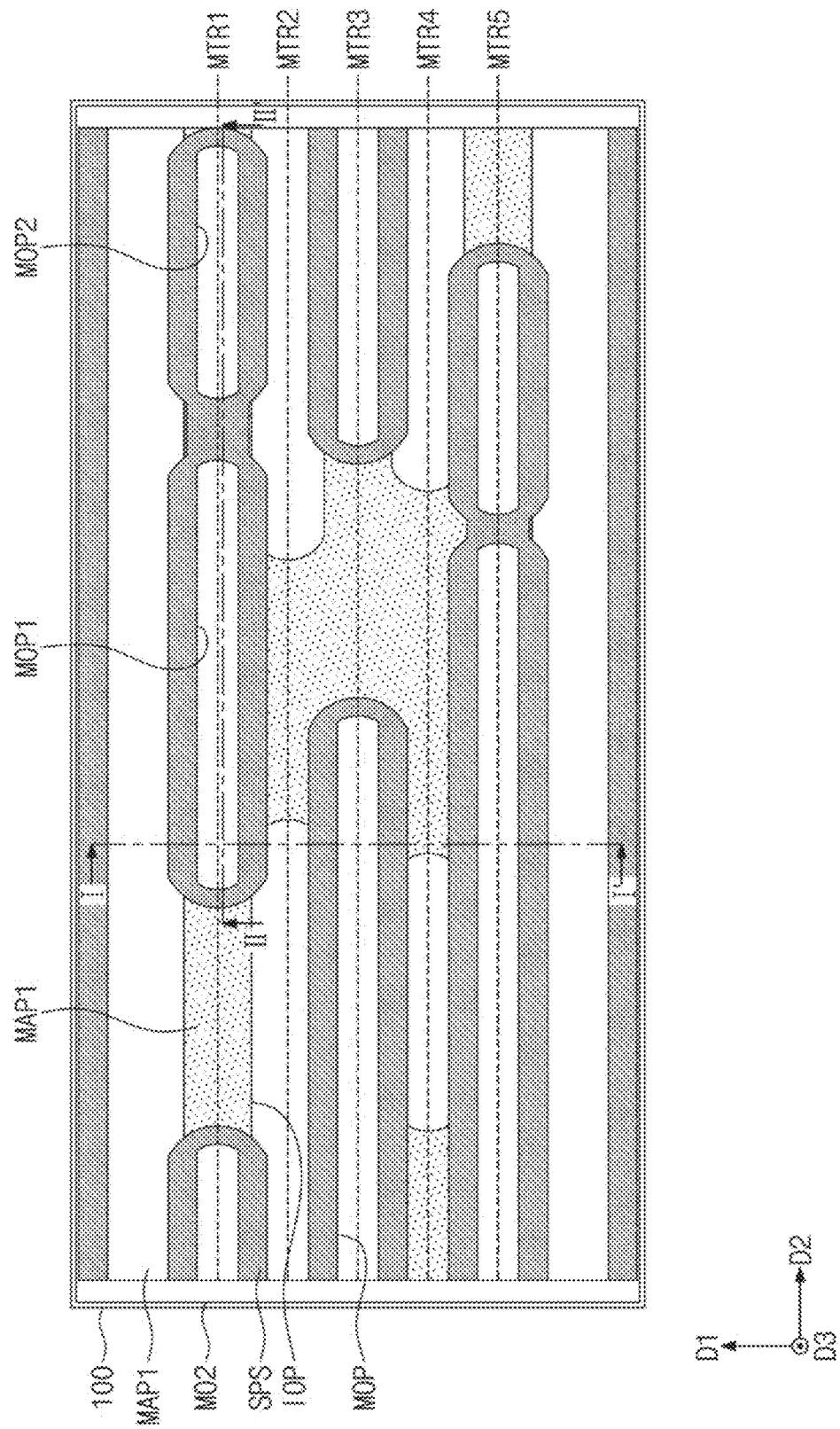
Figure 16A:
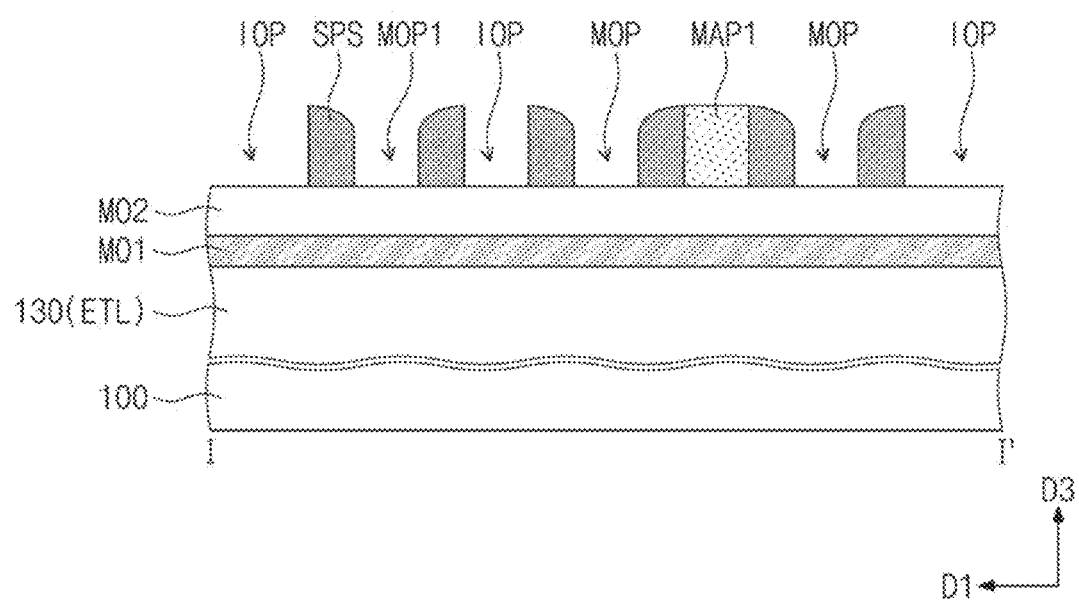
Figure 16B:
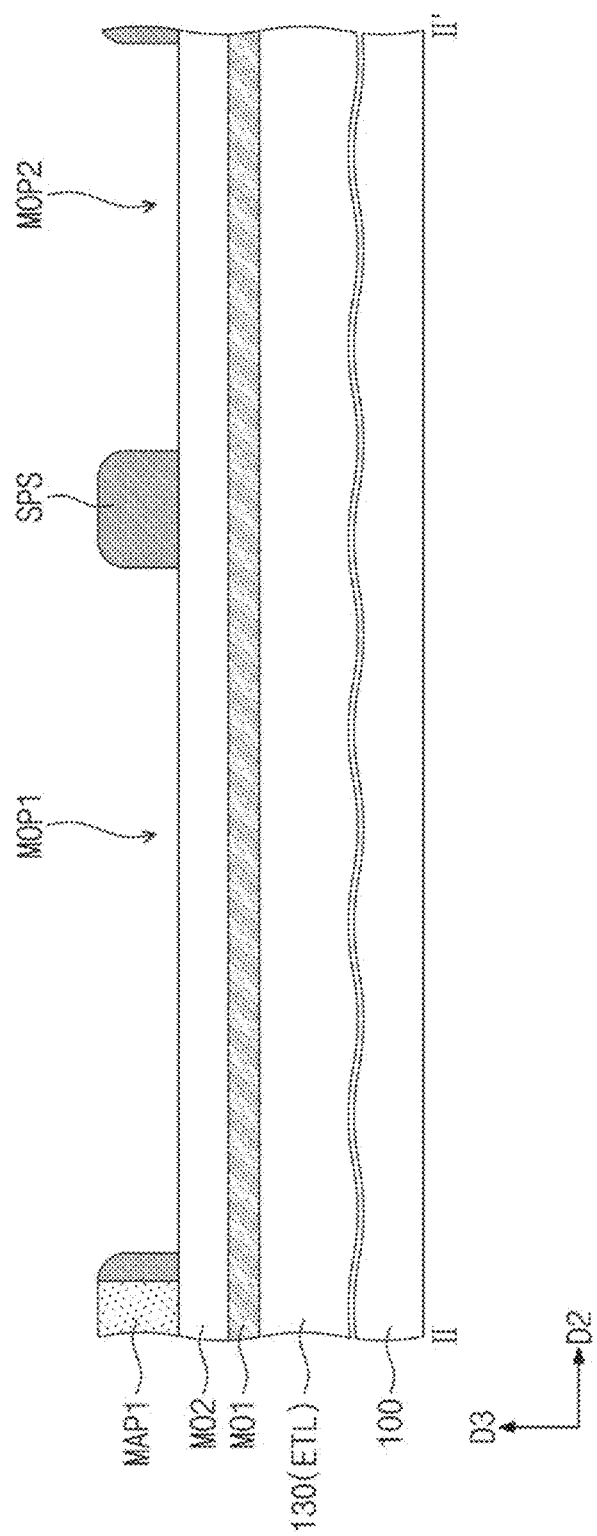

Referring to FIGS. 15, 16A, and 16B, the second mask pattern MAP2 may be used as an etching mask to perform an anisotropic etching process on the first mask pattern MAP1, using, for example, a dry etching process such as a reactive ion etching process. The first mask pattern MAP1 may have a first part exposed to the secondary openings IOP of the second mask pattern MAP2, and the first part of the first mask pattern MAP1 may be selectively removed. The first mask pattern MAP1 may have a second part covered with the second mask pattern MAP2, and the second part of the first mask pattern MAP1 may remain without being removed.

In the anisotropic etching process, the spacers SPS may have an etch selectivity with respect to the first mask pattern MAP1, and therefore the spacers SPS may remain without being removed. For example, the second mold layer MO2 may be exposed to the secondary opening IOP that is self-aligned by the spacer SPS. The second mask pattern MAP2 may be subsequently removed.

The second mold layer MO2 may be provided thereon with the spacers SPS and the first mask pattern MAP1 that is covered with the second mask pattern MAP2. The spacers SPS and the first mask pattern MAP1 may define the primary openings MOP and the secondary openings IOP that expose the top surface of the second mold layer M02.

Figure 17:
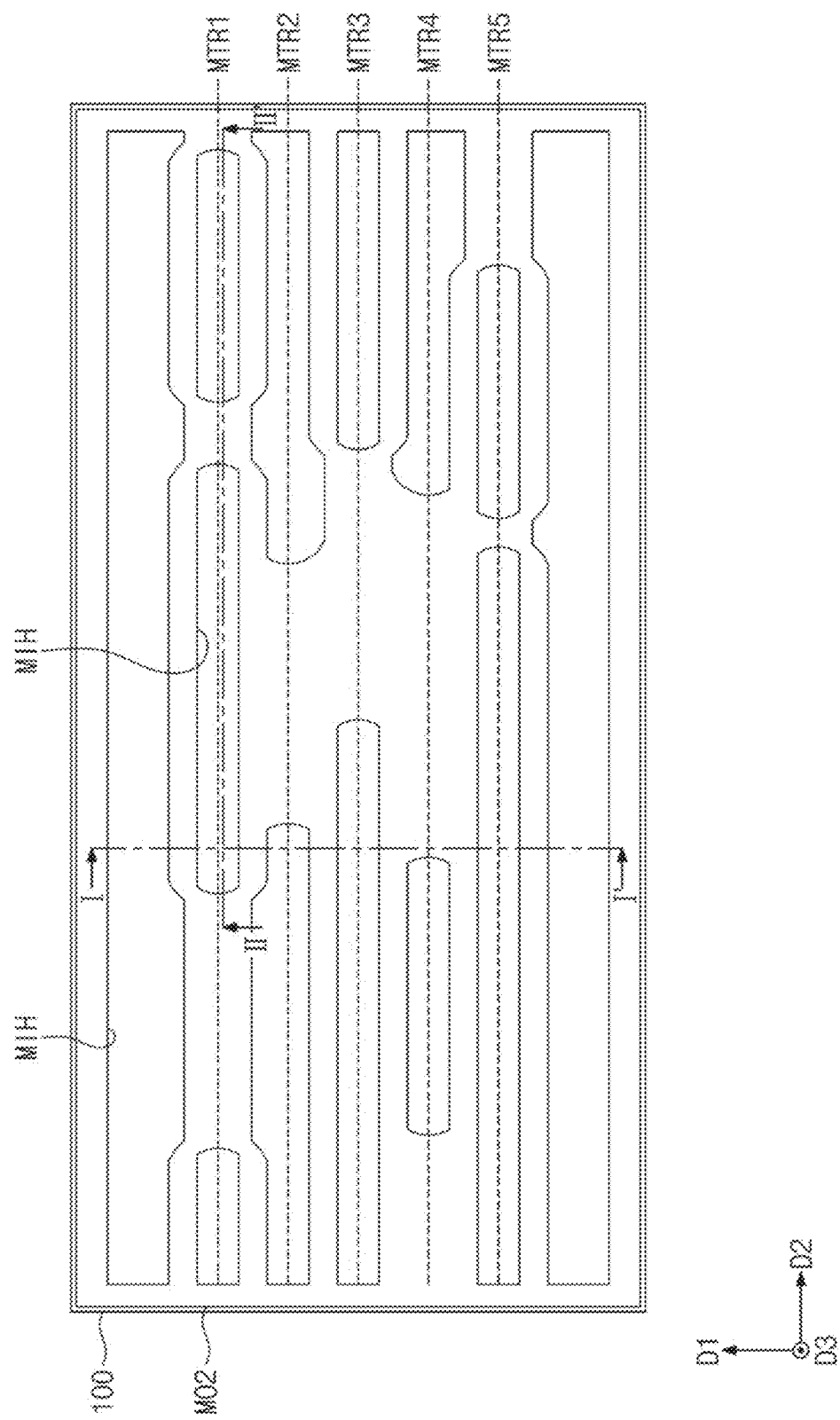
Figure 18A:
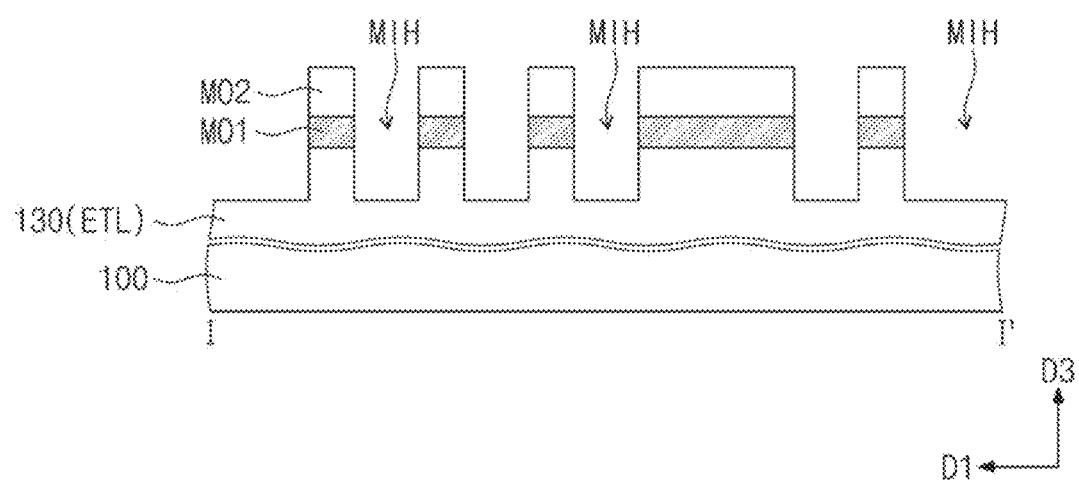
Figure 18B:
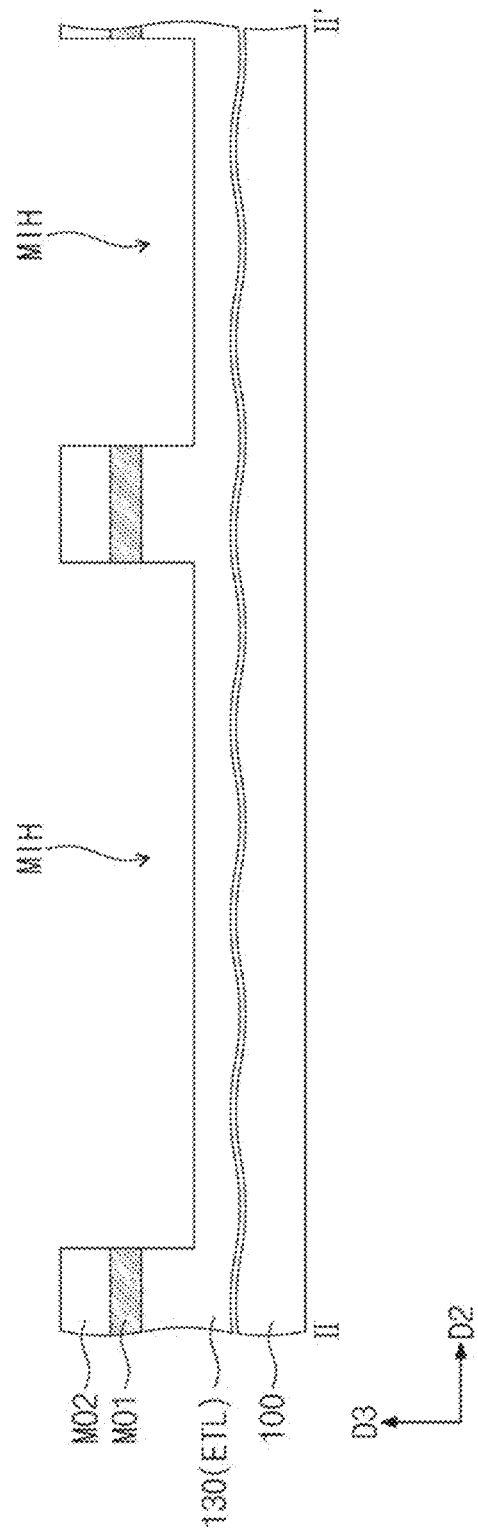

Referring to FIGS. 17, 18A, and 18B, the spacers SPS and the first mask pattern MAP1 may be used as an etching mask to pattern the first and second mold layers MO1 and M02. The patterned first and second mold layers MO1 and MO2 may be used as an etching mask to recess the third interlayer dielectric layer 130 or the etch-target layer ETL. The third interlayer dielectric layer 130 may be recessed to form wiring holes MIH. When viewed in plan, the wiring holes MIH may correspond to the primary openings MOP and the secondary openings IOP. The wiring holes MIH may be aligned with the first to fifth wiring tracks MTR1 to MTR5 and the power track. The wiring holes MIH may be engraved portions of an interlayer dielectric layer which are supposed to be filled with wiring lines of a first metal layer.

Figure 19:
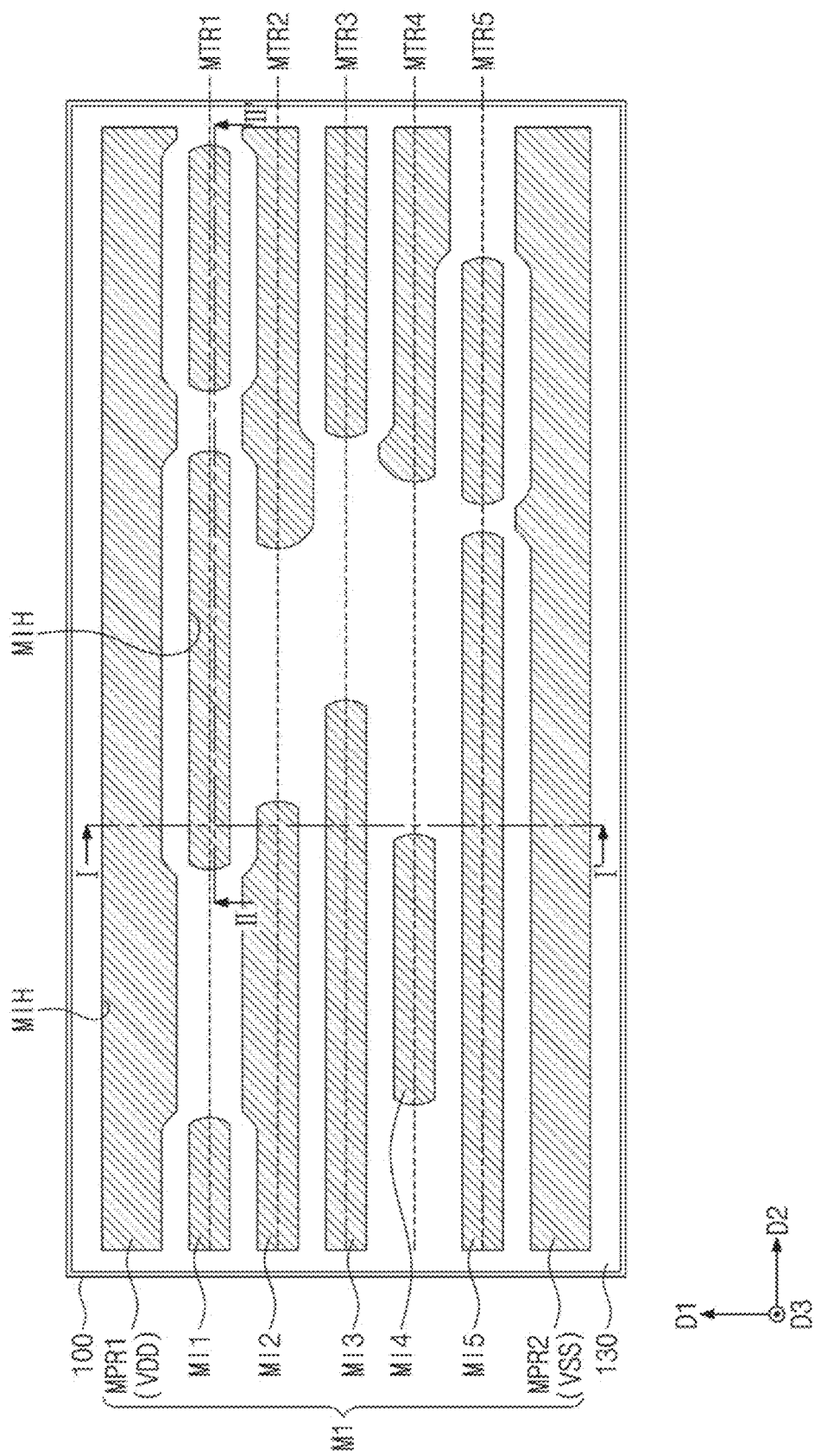
Figure 20A:
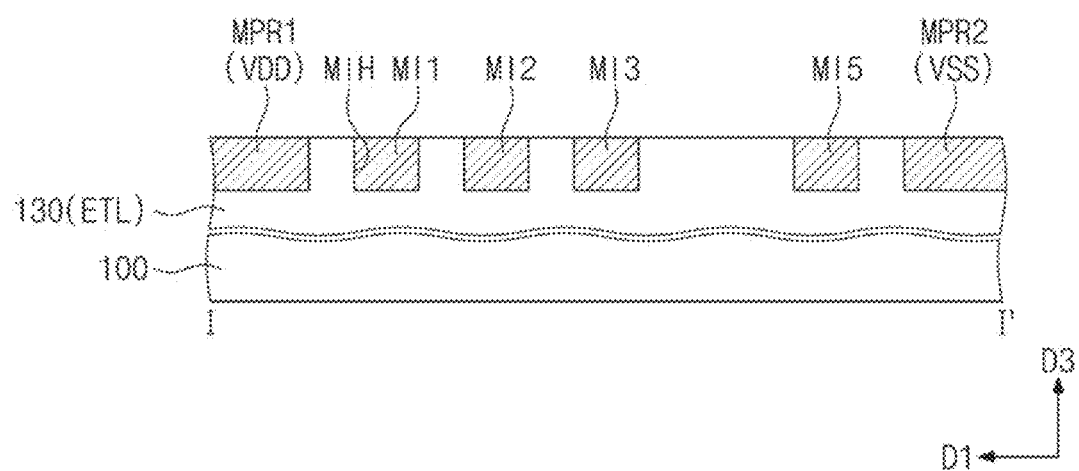
Figure 20B:
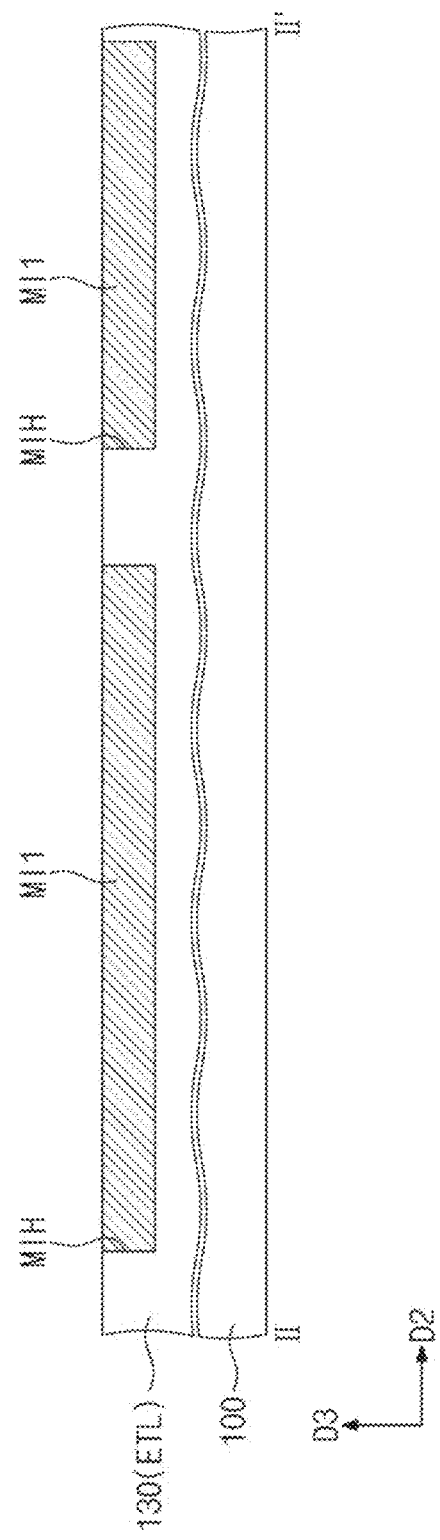

Referring to FIGS. 19, 20A, and 20B, the first and second mold layers MO1 and MO2 may be selectively removed. The wiring holes MIH of the third interlayer dielectric layer 130 may be filled with metal. For example, a barrier layer and a metal layer may be sequentially formed in the wiring holes MIH. The barrier layer may include at least one selected from a tantalum nitride (TaN) layer, a titanium nitride (TiN) layer, a tantalum oxide (TaO) layer, a titanium oxide (TiO) layer, a manganese nitride (MnN) layer, and a manganese oxide (MnO) layer. The metal layer may include at least one selected from copper (Cu), aluminum (Al), ruthenium (Ru), cobalt (Co), tungsten (W), and molybdenum (Mo).

The wiring holes MIH may be filled with metal to form wiring lines of a first metal layer M1. The wiring lines of the first metal layer M1 may include first and second power lines MPR1 and MPR2, and may also include first to fifth lower lines MI1 to MI5 on the first to fifth wiring tracks MTR1 to MTR5. A detailed description of the wiring lines of the first metal layer M1 may be the same as that discussed above with reference to FIGS. 3 and 4.

Figure 21:
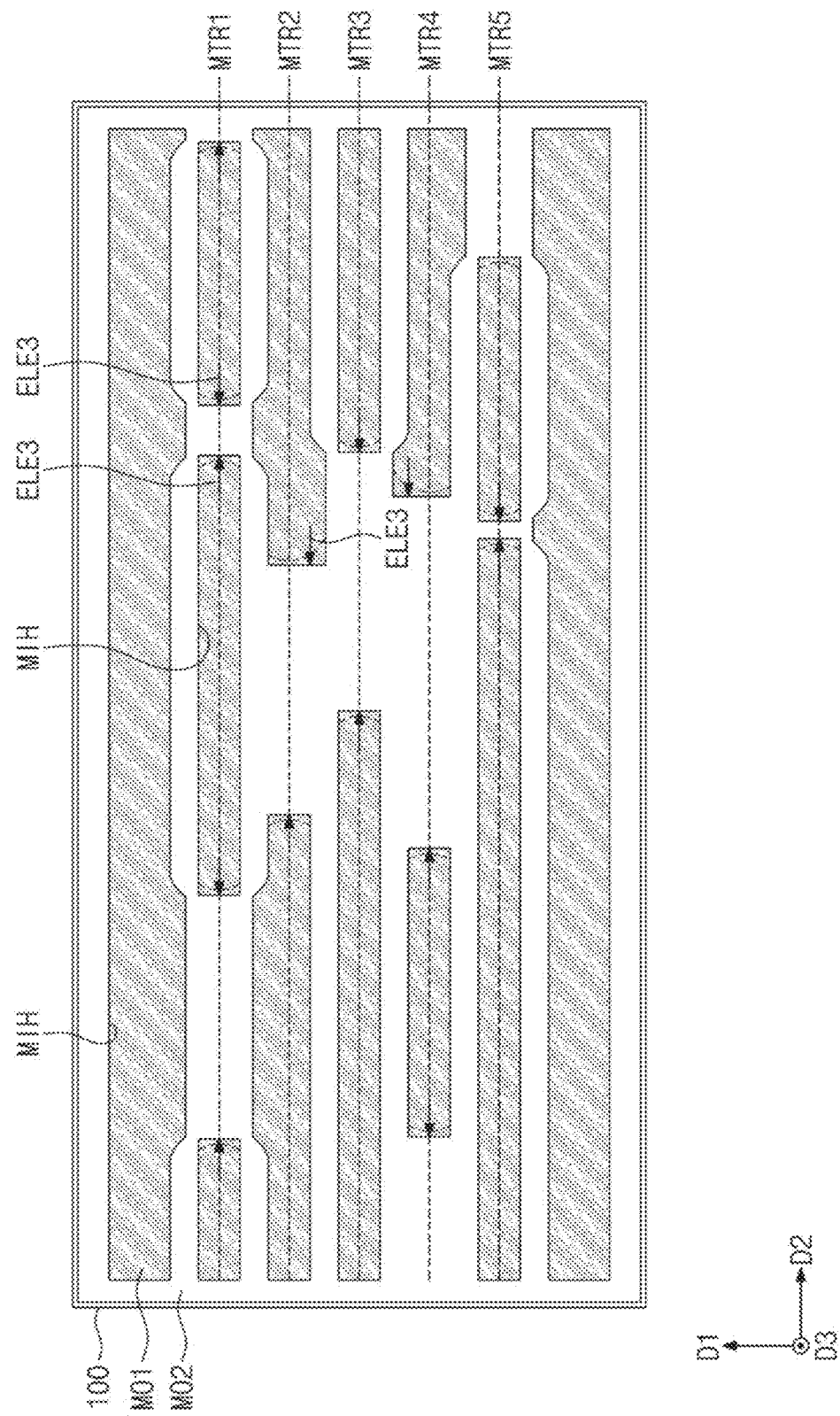
FIGS. 21 and 22 illustrate plan views showing a method of forming a first metal layer according to some example embodiments.
Figure 22:
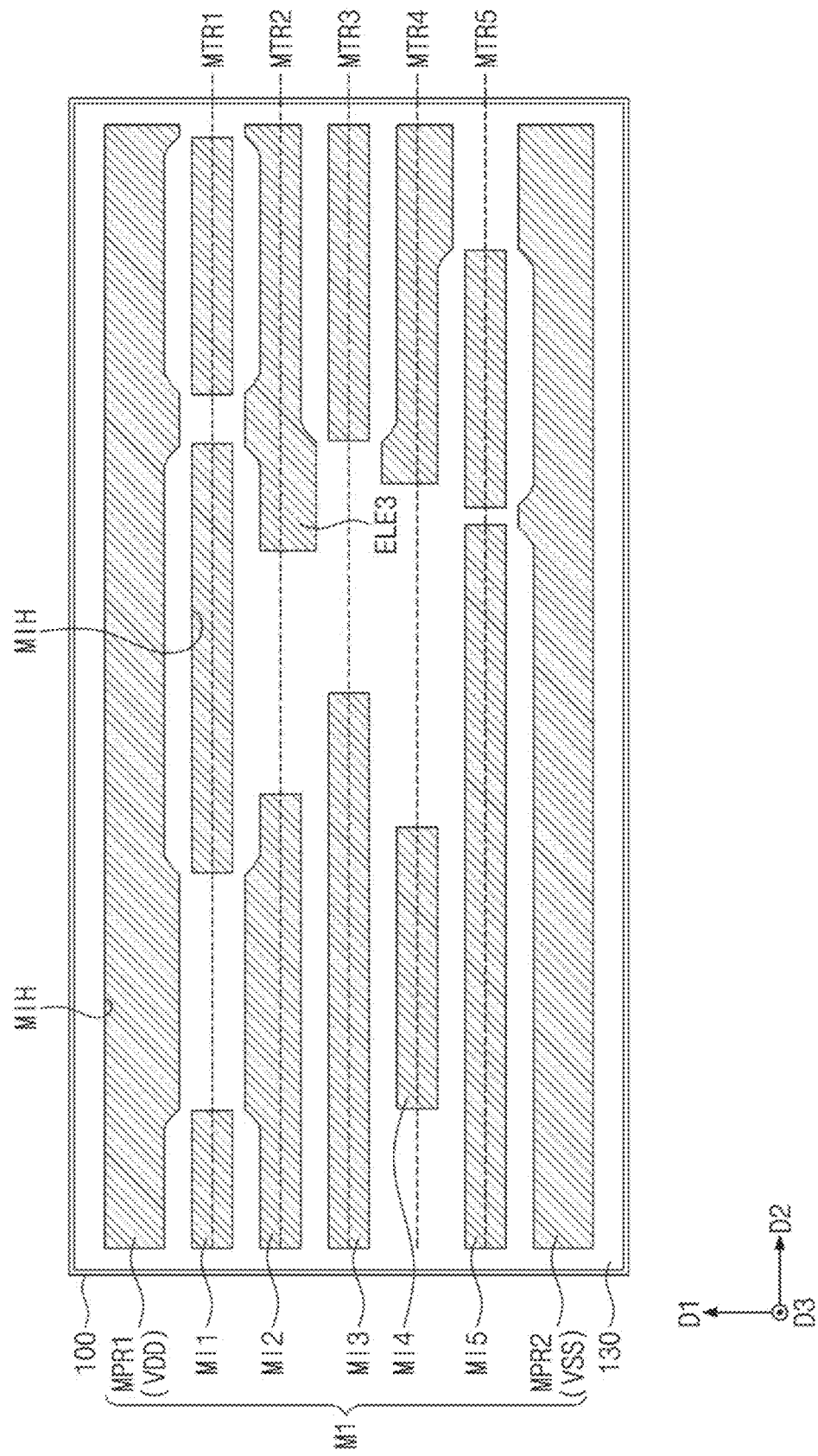

FIGS. 21 and 22 illustrate plan views showing a method of forming a first metal layer according to some example embodiments. In the embodiment that follows, a detailed description of technical features repetitive to those discussed with reference to FIGS. 5 to 20B will be omitted, and a difference thereof will be discussed in detail.

Referring to FIG. 21, the second mold layer MO2 may be patterned by using a resultant structure of FIGS. 15, 16A, and 16B. Therefore, the second mold layer MO2 may be patterned to form wiring holes MIH that expose a top surface of the first mold layer MO1. The wiring holes MIH may correspond to the primary openings MOP and the secondary openings IOP.

The second mold layer MO2 may undergo a third elongation etching process ELE3 to further horizontally expand each of the wiring holes MIH. Identical to the first and second elongation etching processes ELE1 and EL2, the third elongation etching process ELE3 may have directionality in a direction parallel to the second direction D2. During the third elongation etching process ELE3, the second mold layer MO2 may have an etch rate in a direction parallel to the second direction D2 of the second mold layer MO2 greater than an etch rate in a direction parallel to the first direction D1.

For example, the third elongation etching process ELE3 may cause opposite ends of the wiring hole MIH to further horizontally extend. The third elongation etching process ELE3 may reduce a curvature at an end of the wiring hole MIH.

The first and second elongation etching processes ELE1 and ELE3 may affect only ends of wiring lines on the first, third, and fifth wiring tracks MTR1, MTR3, and MTR5. In contrast, the third elongation etching process ELE3 according to some example embodiments may affect ends of all wiring lines on the first to fifth wiring tracks MTR1 to MTR5 and the power track.

Referring to FIG. 22, the second mold layer MO2 may be used as an etching mask to sequentially pattern the first mold layer MO1 and the second mold layer MO2 to form engraved portions (or wiring holes MIH) in the third interlayer dielectric layer 130. The wiring holes MIH may be filled with metal to form wiring lines MPR1, MPR2, and MI1 to MI5 of a first metal layer M1.

According to some example embodiments, the third elongation etching process ELE3 may reduce sharpness of tips of wiring lines, and therefore it may be possible to decrease process defects of the wiring lines. In addition, a tip-to-tip distance between wiring lines of the first metal layer M1 may be reduced to accomplish fineness of the first metal layer M1.

FIGS. 23A, 23B, 23C, and 23D illustrate cross-sectional views respectively taken along lines A-A', B-B', C-C', and D-D' of FIG. 1, showing a semiconductor device according to some example embodiments. In the embodiment that follows, a detailed description of technical features repetitive to those discussed above with reference to FIGS. 1 and 2A to 2D will be omitted, and a difference thereof will be discussed in detail.

The PMOSFET region PR and the NMOSFET region NR may be defined by a second trench TR2 formed on an upper portion of the substrate 100. The second trench TR2 may be positioned between the PMOSFET region PR and the NMOSFET region NR. The PMOSFET region PR and the NMOSFET region NR may be spaced apart from each other in the first direction D1 across the second trench TR2.

First active patterns AP1 and second active patterns AP2 may be provided on the PMOSFET region PR and the NMOSFET region NR, respectively. The first and second active patterns AP1 and AP2 may extend in parallel to each other in the second direction D2. The first and second active patterns AP1 and AP2 may be portions of the substrate 100 that protrude in a vertical direction (or the third direction D3). A first trench TR1 may be defined between neighboring first active patterns AP1 and between neighboring second active patterns AP2. The first trench TR1 may be shallower than the second trench TR2.

A device isolation layer ST may fill the first and second trenches TR1 and TR2. The first and second active patterns AP1 and AP2 may have their upper portions that protrude vertically upwards from the device isolation layer ST (see FIG. 23D). Each of the first and second active patterns AP1 and AP2 may have a fin shape at the upper portion thereof. The device isolation layer ST may not cover any of the upper portions of the first and second active patterns AP1 and AP2. The device isolation layer ST may cover lower sidewalls of the first and second active patterns AP1 and AP2.

First source/drain patterns SD1 may be provided on the upper portions of the first active patterns AP1. The first source/drain patterns SD1 may be impurity regions having a first conductivity type (e.g., p-type). A first channel pattern CH1 may be interposed between a pair of first source/drain patterns SD1. Second source/drain patterns SD2 may be provided on the upper portions of the second active patterns AP2. The second source/drain patterns SD2 may be impurity regions having a second conductivity type (e.g., n-type). A second channel pattern CH2 may be interposed between a pair of second source/drain patterns SD2. A detailed description of the first and second source/drain patterns SD1 and SD2 may be identical or similar to that discussed above with reference to FIGS. 1 and 2A to 2D.

Figure 23A:
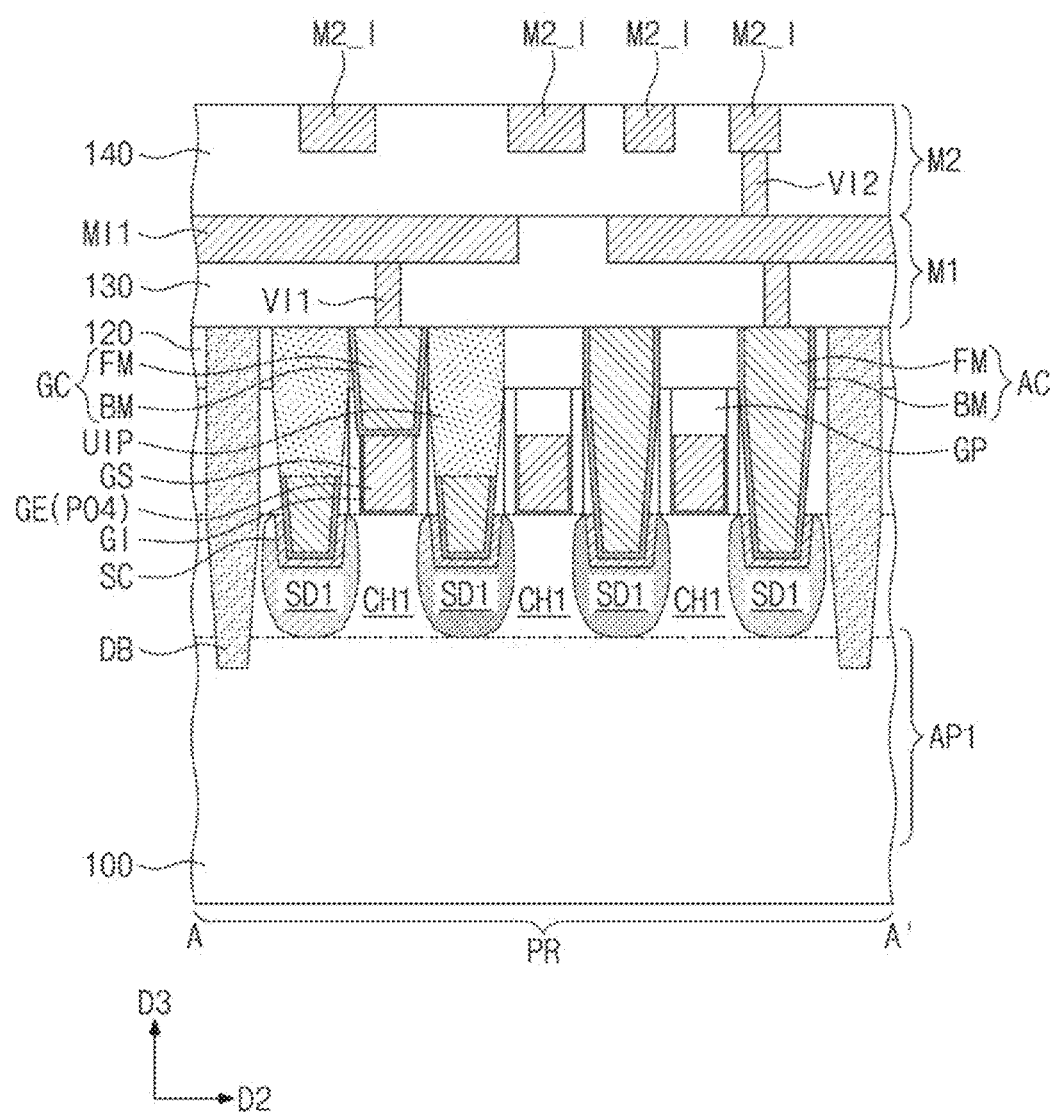
FIGS. 23A, 23B, 23C, and 23D illustrate cross-sectional views respectively taken along lines A-A', B-B', C-C', and D-D' of FIG. 1, showing a semiconductor device according to some example embodiments.
Figure 23B:
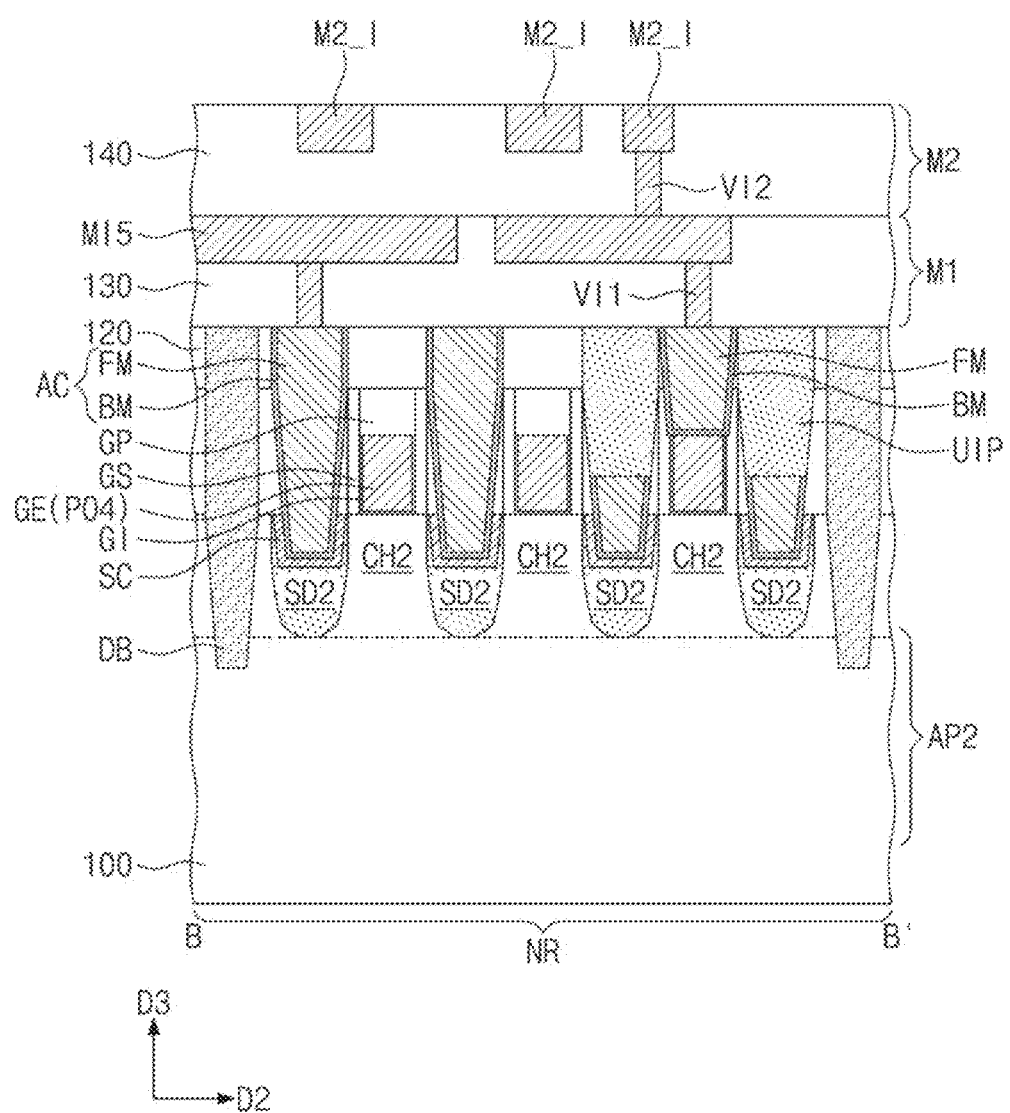
Figure 23C:
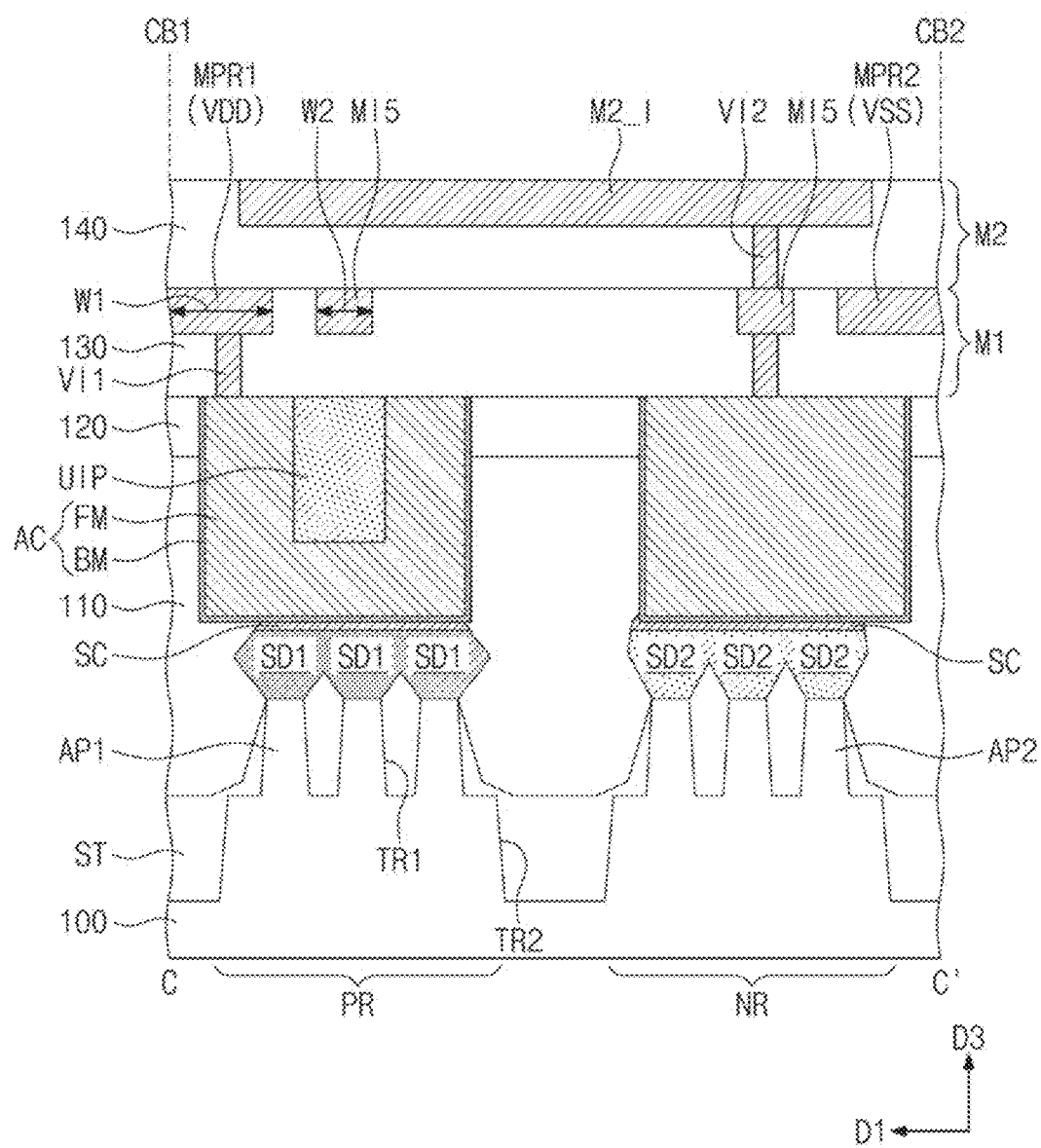
Figure 23D:
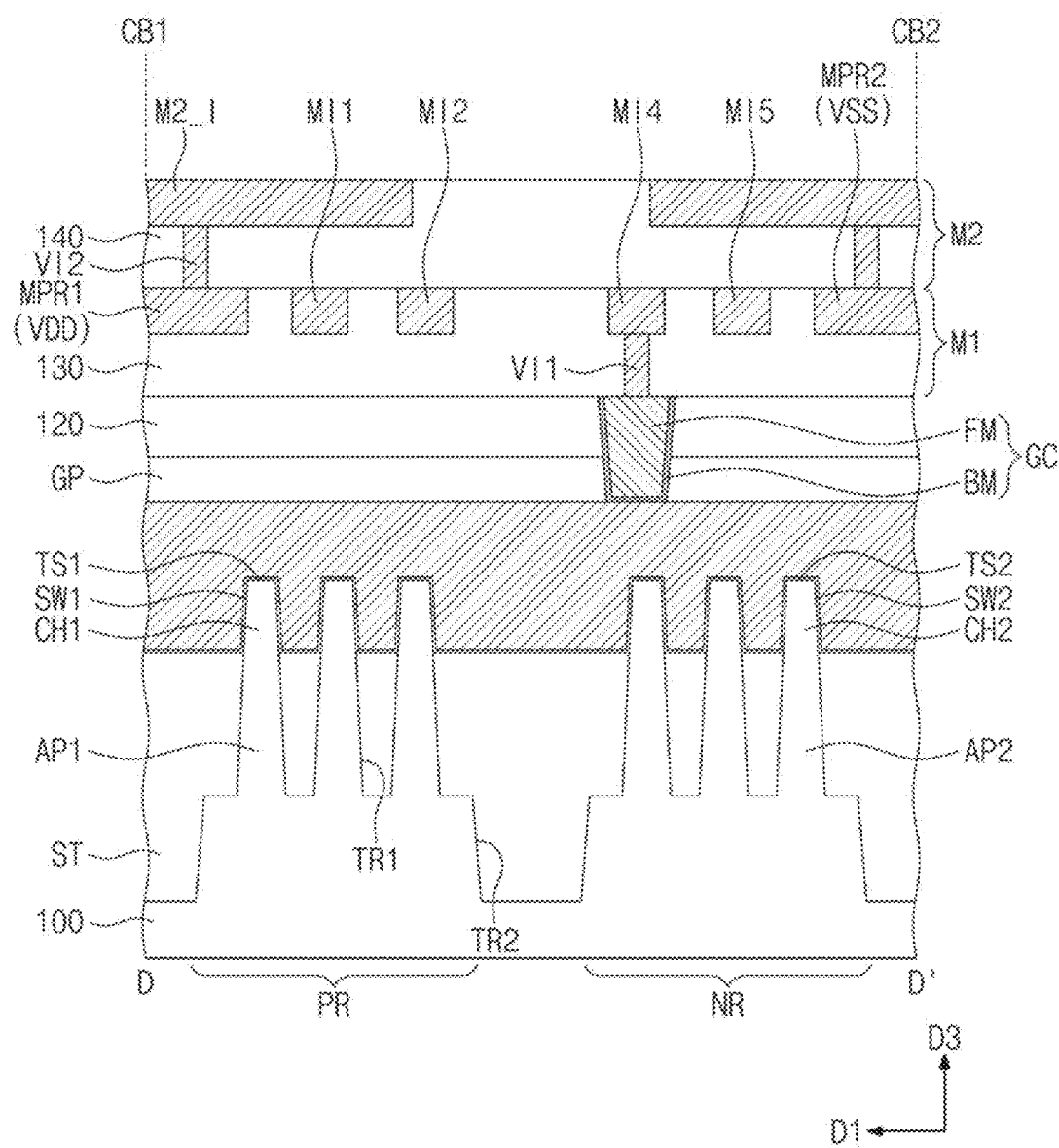

Gate electrodes GE may be provided to extend in the first direction D1, while running across the first and second active patterns AP1 and AP2. The gate electrodes GE may vertically overlap the first and second channel patterns CH1 and CH2. Each of the gate electrodes GE may surround a top surface and opposite sidewall sidewalls of each of the first and second channel patterns CH1 and CH2. Referring to FIG. 23D, the gate electrode GE may be provided on a first top surface TS1 of the first channel pattern CH1 and on at least one first sidewall SW1 of the first channel pattern CH1. The gate electrode GE may be provided on a second top surface TS2 of the second channel pattern CH2 and on at least one second sidewall SW2 of the second channel pattern CH2. For example, a transistor according to some example embodiments may be a three-dimensional field effect transistor (e.g., FinFET) in which the gate electrode GE three-dimensionally surrounds the first and second channel patterns CH1 and CH2.

A detailed description of the active and gate contacts AC and GC and the first and second metal layers M1 and M2 may be substantially the same as that discussed above with reference to FIGS. 1 and 2A to 2D.

According to some example embodiments, a semiconductor device may be achieved not by performing a photolithography process, but by performing an elongation etching process on wiring lines that are adjacent to each other at a critical distance. For example, the elongation etching process may form tips of the wiring lines that are adjacent to each other. Therefore, it may be possible to prevent or reduce the likelihood of and/or impact from process defects and variations that can be generated at the tips of the wiring lines, and the semiconductor device may thus increase in reliability and/or in yield.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

Although some example embodiments of inventive concepts have been discussed with reference to accompanying figures, it will be understood that various changes in form and details may be made therein without departing from the spirit and scope of inventive concepts. It therefore will be understood that various example embodiments described above are just illustrative but not limitative in all aspects. Furthermore example embodiments are not necessarily mutually exclusive. For example, some example embodiments may include features described with reference to one or more figures, and may also include features described with reference to one or more other figures.

What is claimed is:

1. A semiconductor device, comprising:
    a logic cell on a substrate, the logic cell including a PMOSFET region and an NMOSFET region; and
    a first metal layer on the logic cell,
    wherein the first metal layer includes,
        a first power line and a second power line that extend parallel to each other along a first direction, and
        a first lower line, a second lower line, and a third lower line respectively on a first wiring track, a second wiring track, and a third wiring track that are defined between the first power line and the second power line, wherein the first wiring track, the second wiring track, and the third wiring track extend parallel to each other along the first direction, the first lower line includes a first line and a second line that are spaced apart from each other in the first direction at a first distance, the third lower line includes a third line and a fourth line that are spaced apart from each other in the first direction at a second distance different from the first distance, the first line has a first convex end that faces the second line and a third convex end that is opposite to the first end, and a convex curvature at the third end is different from a convex curvature at the first end, the third line has a second end that faces the fourth line, and a curvature at the first end is the same as a curvature at the second end.

2. The semiconductor device of claim 1, wherein
the first distance corresponds to a tip-to-tip distance between the first line and the second line,
the second distance corresponds to a tip-to-tip distance between the third line and the fourth line, and
each of the first distance and the second distance is in a range of about 24 nm to about 60 nm.

3. The semiconductor device of claim 1, wherein
the second lower line includes a first protrusion and a second protrusion that are on opposite sides of the second lower line,
the first protrusion protrudes toward a first region between the first line and the second line, and
the second protrusion protrudes toward a second region between the third line and the fourth line.

4. The semiconductor device of claim 3, wherein
a line-width of each of the first, second, third, and fourth lines is constant in the first direction without being changed, and
a line-width of the second lower line is not constant based on the first protrusion and the second protrusion.

5. The semiconductor device of claim 1, wherein the curvature at the third end is less than the curvature at the first end.

6. The semiconductor device of claim 1, wherein
the first lower line and the third lower line are first photomask lines, and
the first power line, the second power line, and the second lower line are second photomask lines.

7. The semiconductor device of claim 1, wherein the second end is convexly rounded.

8. The semiconductor device of claim 1, further comprising:
a first active pattern and a second active pattern on the PMOSFET region and the NMOSFET region, respectively;
a device isolation layer on an upper portion of the substrate, the device isolation layer defining the first active pattern and the second active pattern;
a first channel pattern and a second channel pattern on the first active pattern and the second active pattern, respectively;
a plurality of first source/drain patterns on opposite sides of the first channel pattern, respectively;
a plurality of second source/drain patterns on opposite sides of the second channel pattern, respectively;
a gate electrode running across the first channel pattern and the second channel pattern, the gate electrode extending in a second direction that intersects the first direction;
an active contact connected to at least one of the first and second source/drain patterns; and
a gate contact connected to the gate electrode,
wherein the first metal layer is on and connected to the active contact and the gate contact.

9. A semiconductor device, comprising:
a logic cell on a substrate, the logic cell including a PMOSFET region and an NMOSFET region; and
a first metal layer on the logic cell,
wherein the first metal layer includes,
a first power line and a second power line that extend parallel to each other along a first direction; and
a first lower line, a second lower line, and a third lower line respectively on a first wiring track, a second wiring track, and a third wiring track that are defined between the first power line and the second power line,
wherein the first wiring track, the second wiring track, and the third wiring track extend parallel to each other along the first direction,
the first lower line includes a first line and a second line that extend parallel to each other along the first direction,
the third lower line includes a third line and a fourth line that extend parallel to each other along the first direction,
a tip-to-tip distance between the first line and the second line is a first distance,
a tip-to-tip distance between the third line and the fourth line is a second distance,
each of the first distance and the second distance is a specific distance having a value between about 24 nm and about 60 nm,
the first distance and the second distance are different from each other,
the first lower line and the first power line are immediate neighbors in a second direction perpendicular to the first direction, and the third lower line and the second power line are immediate neighbors in the second direction, and
the first power line has a first protrusion in the second direction between the first and second lines, and the second power line has a second protrusion in the second direction between the third and fourth lines.

10. The semiconductor device of claim 9, wherein a curvature at a tip of each of the first line and the second line is the same as a curvature at a tip of each of the third line and the fourth line.

11. The semiconductor device of claim 10, wherein a curvature at a tip of the second lower line is different from the curvature at the tip of each of the first line and the second line.

12. The semiconductor device of claim 9, wherein
a tip of each of the first line and the second line is convexly rounded, and
a tip of each of the third line and the fourth line is convexly rounded.

13. The semiconductor device of claim 9, wherein
the first lower line and the third lower line are first photomask lines, and
the first power line, the second power line, and the second lower line are second photomask lines.

14. A semiconductor device, comprising:

an active pattern on a substrate;

a device isolation layer that fills a trench defining the active pattern;

a source/drain pattern on the active pattern and a channel pattern connected to the source/drain pattern, the channel pattern including a first semiconductor pattern, a second semiconductor pattern, and a third semiconductor pattern that are sequentially stacked and spaced apart from each other;

a gate electrode that extends while running across the channel pattern, the gate electrode includes a first part between the active pattern and the first semiconductor pattern, a second part between the first semiconductor pattern and the second semiconductor pattern, a third part between the second semiconductor pattern and the third semiconductor pattern, and a fourth part on the third semiconductor pattern;

a gate dielectric layer between the channel pattern and the gate electrode;

a plurality of gate spacers on opposite sidewalls of the fourth part of the gate electrode;

a gate capping pattern on a top surface of the gate electrode;

a first interlayer dielectric layer on the gate capping pattern;

an active contact that penetrates the first interlayer dielectric layer and is coupled to the source/drain pattern;

a gate contact that penetrates the first interlayer dielectric layer and couples to the gate electrode;

a second interlayer dielectric layer on the first interlayer dielectric layer;

a first metal layer in the second interlayer dielectric layer, the first metal layer connected to the active contact and the gate contact;

a third interlayer dielectric layer on the second interlayer dielectric layer; and a second metal layer in the third interlayer dielectric layer, wherein the first metal layer includes, a first power line and a second power line that extend parallel to each other along a first direction, and a first lower line, a second lower line, and a third lower line respectively on a first wiring track, a second wiring track, and a third wiring track that are defined between the first power line and the second power line, wherein the first, second, and third wiring tracks extend parallel to each other along the first direction, the first lower line includes a first line and a second line that are spaced apart from each other in the first direction by a first distance, the third lower line includes a third line and a fourth line that are spaced apart from each other in the first direction by a second distance different from the first distance, the first line has a first convex end that faces the second line and a third convex end opposite to the first end, the third line has a second end that faces the fourth line, a convex curvature at the first end is the same as a convex curvature at the second end and is different from a convex curvature of the third convex end, and the first lower line and the first power line are immediate neighbors in a second direction perpendicular to the first direction, and the third lower line and the second power line are immediate neighbors in the second direction.

15. The semiconductor device of claim 14, wherein the first distance is a tip-to-tip distance between the first line and the second line, the second distance is a tip-to-tip distance between the third line and the fourth line, and each of the first distance and the second distance is in a range of about 24 nm to about 60 nm.

16. The semiconductor device of claim 14, wherein the first line has a third end that is opposite to the first end, and a curvature at the third end is different from the curvature at the first end.

17. The semiconductor device of claim 14, wherein the first lower line and the third lower line are first photomask lines, and the first power line, the second power line, and the second lower line are second photomask lines.

18. The semiconductor device of claim 14, wherein the second end is convexly rounded.

\* \* \* \* \*